(12) United States Patent
Moh et al.

(10) Patent No.: US 9,263,434 B2
(45) Date of Patent: Feb. 16, 2016

(54) ARRAY SUBSTRATE, DISPLAY APPARATUS HAVING THE SAME AND METHOD OF MANUFACTURING THE SAME

(75) Inventors: Sang-Moon Moh, Hwaseong-si (KR); Mi-Sun Lee, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1095 days.

(21) Appl. No.: 13/168,498

(22) Filed: Jun. 24, 2011

(65) Prior Publication Data

US 2012/0211772 A1 Aug. 23, 2012

(30) Foreign Application Priority Data

Feb. 23, 2011 (KR) .................. 10-2011-0016049

(51) Int. Cl.
*H01L 29/18* (2006.01)
*H01L 27/02* (2006.01)
*H01L 27/12* (2006.01)

(52) U.S. Cl.
CPC ........... *H01L 27/0288* (2013.01); *H01L 27/124* (2013.01); *H01L 27/1251* (2013.01)

(58) Field of Classification Search
USPC .................. 257/59, 72; 349/38–46, 139–152
See application file for complete search history.

(56) References Cited

U.S. PATENT DOCUMENTS

| 5,929,829 | A  | * | 7/1999 | Pitt ................... G02F 1/136204 345/87 |
| 6,380,591 | B1 | * | 4/2002 | Kawano ............ G02F 1/136204 257/355 |
| 2006/0001792 | A1 | * | 1/2006 | Choi ................... G02F 1/13458 349/54 |
| 2006/0114399 | A1 | * | 6/2006 | Kim ..................... G02F 1/1362 349/139 |
| 2008/0012812 | A1 | * | 1/2008 | Kawata ................ G09G 3/3648 345/90 |
| 2010/0123846 | A1 | * | 5/2010 | Kim ..................... G02F 1/1345 349/46 |

FOREIGN PATENT DOCUMENTS

| KR | 0577779 | 5/2006 |
| KR | 1020060079698 | 7/2006 |
| KR | 1020060103652 | 10/2006 |
| KR | 0878271 | 1/2009 |

* cited by examiner

*Primary Examiner* — Cuong Q Nguyen
*Assistant Examiner* — Nishath Yasmeen
(74) *Attorney, Agent, or Firm* — H.C. Park & Associates, PLC

(57) ABSTRACT

An array substrate includes a substrate, a dummy pad and a driving signal output line. The substrate includes a display area displaying an image, and a peripheral area surrounding the display area. The dummy pad extends along a first direction in the peripheral area of the substrate, and includes a first protrusion portion protruding from an end portion of the dummy pad along the first direction. The driving signal output line extends along a second direction crossing with the first direction, is disposed adjacent to the dummy pad, and provides an external signal. Accordingly static electricity provided to the driving signal output line flows into the dummy pad having the first protrusion portion, so that static electricity may be prevented from flowing into the display area.

8 Claims, 18 Drawing Sheets

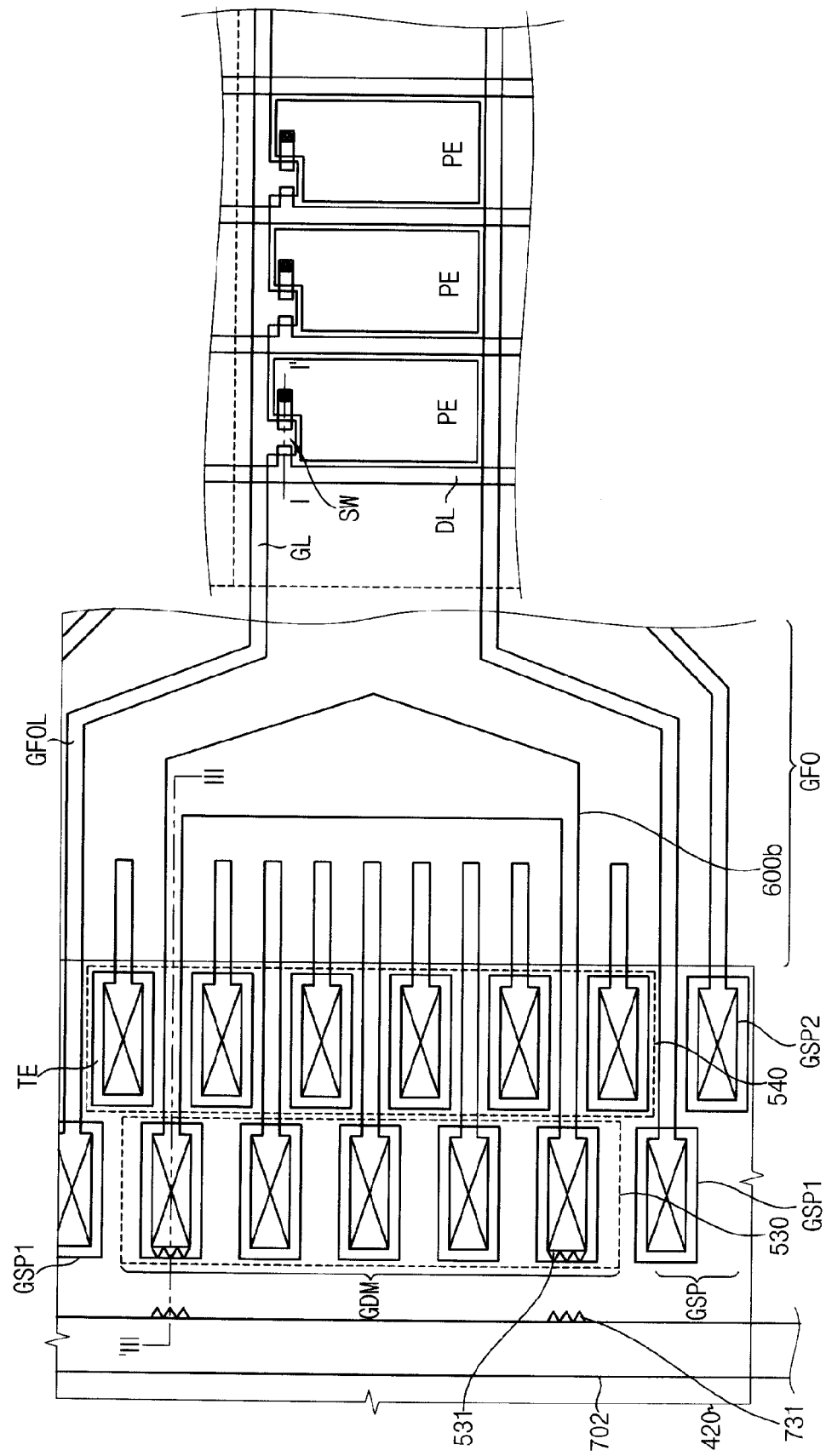

ARRAY SUBSTRATE, DISPLAY APPARATUS HAVING THE SAME AND METHOD OF MANUFACTURING THE SAME

CROSS REFERENCE TO RELATED APPLICATION

This application claims priority under 35 U.S.C. §119 to Korean Patent Application No. 2011-0016049, filed on Feb. 23, 2011 in the Korean Intellectual Property Office (KIPO), the contents of which are herein incorporated by reference in their entireties.

BACKGROUND

1. Field of the Invention

Example embodiments of the present invention relate to an array substrate, a display apparatus having the array substrate, and a method of manufacturing the array substrate. More particularly, example embodiments of the present invention relate to an array substrate having a chip-on glass (COG) type mount, a display apparatus having the array substrate, and a method of manufacturing the array substrate.

2. Discussion of the Background

In general, a display apparatus includes a display panel including an array substrate and an opposing substrate facing the array substrate. The display panel includes a display area to display an image, and a peripheral area surrounding the display area. In the display area, a switching element and a pixel electrode are formed. In the peripheral area, data and gate drivers to drive the switching element and the pixel electrode, and an electrostatic prevention diode or an electrostatic prevention transistor disposed between the switching element and the data and gate drivers, are formed.

The data and gate drivers are mounted in the peripheral area of the array substrate as a chip-on-film (COF) type mount or a chip-on-glass (COG) type mount. When the data and gate drivers are mounted in the peripheral area of the array substrate as a COG type mount, a driver driving line as well as a chip is directly mounted on the array substrate. The driver driving line may include a power source line, a data driving line and a gate driving line, etc.

Particularly, when the power source line is disposed on the array substrate, a voltage drop is relatively high compared to a case where the power source line is disposed on a tape. To solve a higher voltage drop problem of the power source line disposed on the array substrate, a width of the power source line may be increased to decrease the voltage drop. In addition, the power source line may be disposed between input and output bumps of the chip, so that space on the display panel may be used efficiently.

However, when the power source line having a wide width is disposed between the input and output bumps of the chip, a static electricity may easily flow through the power source line. The static electricity provided from the power source line may flow into data and gate lines through data and gate pads respectively, so that an electrostatic diode of the peripheral area may be damaged. In addition, a damage of the electrostatic diode may induce a damage of a line of the display area.

The above information disclosed in this Background section is only for enhancement of understanding of the background of the invention and therefore it may contain information that does not form any part of the prior art.

SUMMARY

Example embodiments of the present invention provide an array substrate preventing an influx of a static electricity provided through a driving signal output line.

Example embodiments of the present invention also provide a display apparatus including the above array substrate.

Example embodiments of the present invention also provide a method of manufacturing the above array substrate.

In an example embodiment, an array substrate includes a substrate, a dummy pad and a driving signal output line. The substrate includes a display area displaying an image, and a peripheral area surrounding the display area. The dummy pad extends along a first direction in the peripheral area of the substrate, and includes a first protrusion portion protruding from an end portion of the dummy pad along the first direction. The driving signal output line extends along a second direction crossing with the first direction, is disposed adjacent to the dummy pad, and provides a driving signal.

In an example embodiment, the array substrate may further include a signal pad and an electrostatic capacitor. The signal pad may be disposed susbstantially parallel with the dummy pad. The electrostatic capacitor may be disposed in the peripheral area between the signal pad and the display area and between dummy pad and the display area, and be electrically connected to the dummy pad.

In an example embodiment, the array substrate may further include a signal pad and an electrostatic prevention unit and an electrostatic induction diode. The signal pad may be disposed substantially parallel with the dummy pad. The electrostatic prevention unit may be disposed in the peripheral area between the signal pad and the display area and between the dummy pad and the display area, and be electrically connected to the signal pad. The electrostatic induction diode may be disposed between the driving signal output line and the display area, and be electrically connected to the dummy pad and the electrostatic prevention unit.

In an example embodiment, the first protrusion portion may include a wedge shape.

In an example embodiment, a display apparatus includes an array substrate and a driving driver. The array substrate includes a substrate, a dummy pad, a driving signal output line. The substrate includes a display area to display an image and a peripheral area surrounding the display area. The dummy pad extends along a first direction in the peripheral area of the substrate, and includes a first protrusion portion protruding from an end portion of the dummy pad along the first direction. The driving signal output line is disposed adjacent to the dummy pad, extends along a second direction crossing with the first direction, and provides a driving signal. The driving driver is disposed over the dummy pad, and is electrically connected to the dummy pad.

In an example embodiment, the display apparatus may further include a signal pad and an electrostatic capacitor. The signal pad may be electrically connected to the driving driver, and be disposed substantially parallel with the dummy pad. The electrostatic capacitor may be disposed in the peripheral area between the driving driver and the display area, and be electrically connected to the dummy pad. The dummy pad may be disposed between the signal pads.

In an example embodiment, the display apparatus may further include a signal pad and an electrostatic capacitor. The signal pad may be electrically connected to the driving driver, and be disposed substantially parallel with the dummy pad. The electrostatic capacitor may be disposed on the peripheral area between the display area and the driving signal output line between adjacent driving drivers, and be electrically connected to the dummy pad. The dummy pad may be disposed on an edge portion of the signal pad.

In an example embodiment, the display apparatus may further include a signal pad, an electrostatic prevention unit and an electrostatic induction diode. The signal pad may be electrically connected to the driving driver, and be disposed substantially parallel with the dummy pad. The electrostatic prevention unit may be disposed in the peripheral area between adjacent driving drivers and the display area, and be electrically connected to the signal pad. The electrostatic induction diode may be disposed in the peripheral area between the display area and the driving signal output line, and be electrically connected to the dummy pad and the electrostatic prevention unit.

In an example embodiment, the first protrusion portion may include a wedge shape.

In a method of manufacturing an array substrate according to an example embodiment, a first metal layer is formed on a substrate including a display area displaying an image, and a peripheral area surrounding the display area. A dummy pad and a driving signal output line are formed by patterning the first metal layer in the peripheral area of the substrate, where the dummy pad extends along a first direction, and includes a first dummy electrode including a first protrusion portion protruding from an end portion of the dummy pad along the first direction, and the driving signal output line extends along a second direction crossing with the first direction, and includes a first output line disposed spaced apart from the dummy pad.

According to example embodiments of the array substrate, the display apparatus having the array substrate, and the method of manufacturing the array substrate, at least one of dummy pads disposed adjacent to signal pads have a first protrusion portion protruding toward a driving signal output line disposed adjacent to the signal and dummy pads, and a static electricity provided to the driving signal output line is induced to flow into an electrostatic capacitor electrically connected to the dummy pad, so that damage to a switching element in the display area may be prevented.

In addition, the driving signal output line has a second protrusion facing the first protrusion of the dummy pad, and the static electricity provided to the driving signal output line is induced to flow into an electrostatic capacitor electrically connected to the dummy pad, so that damage to a switching element in the display area may be prevented.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 2B is an enlarged plan view of portion 'B' in FIG. 1.

DETAILED DESCRIPTION OF THE ILLUSTRATED EMBODIMENTS

Hereinafter, example embodiments of the present invention will be explained in detail with reference to the accompanying drawings.

Figure 1:
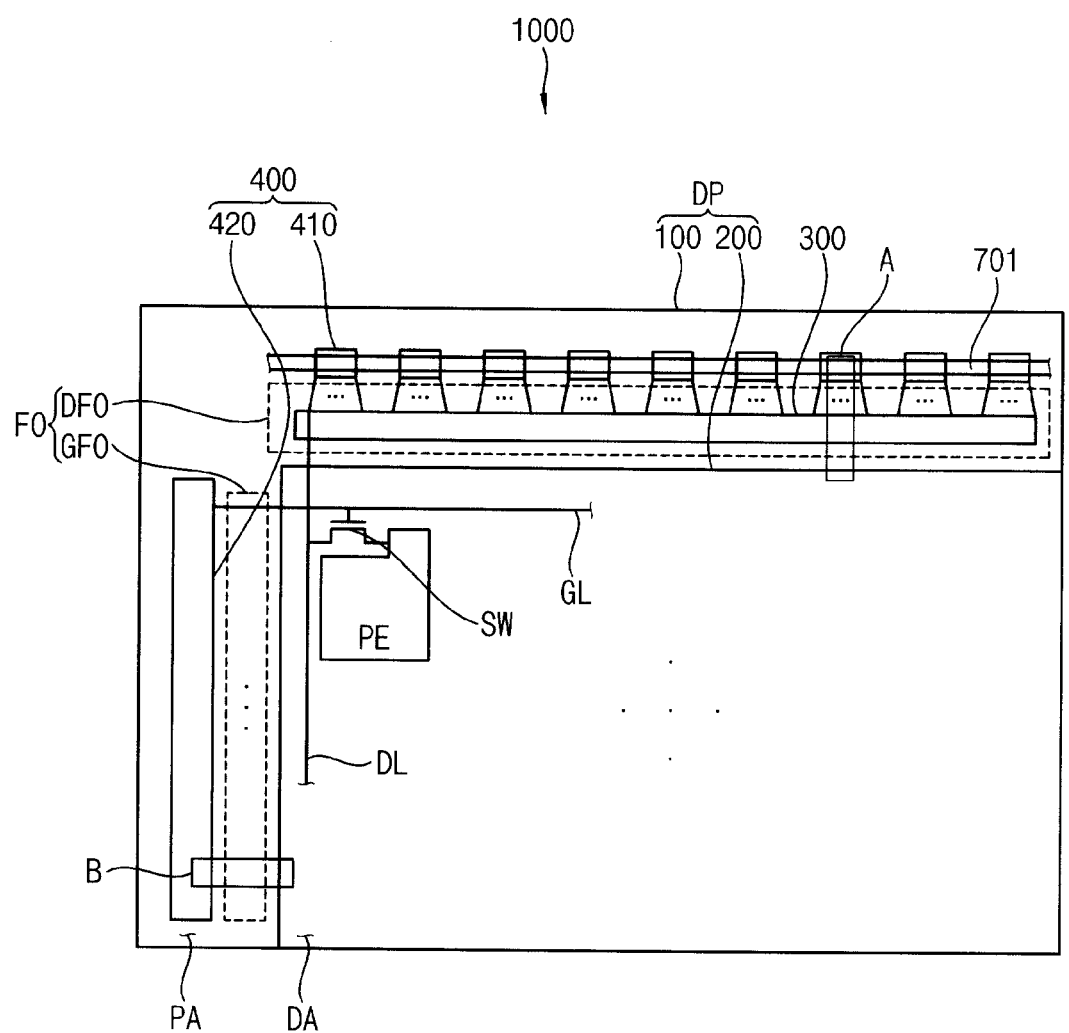
FIG. 1 is a plan view illustrating a display apparatus according to an example embodiment.
Figure 2A:
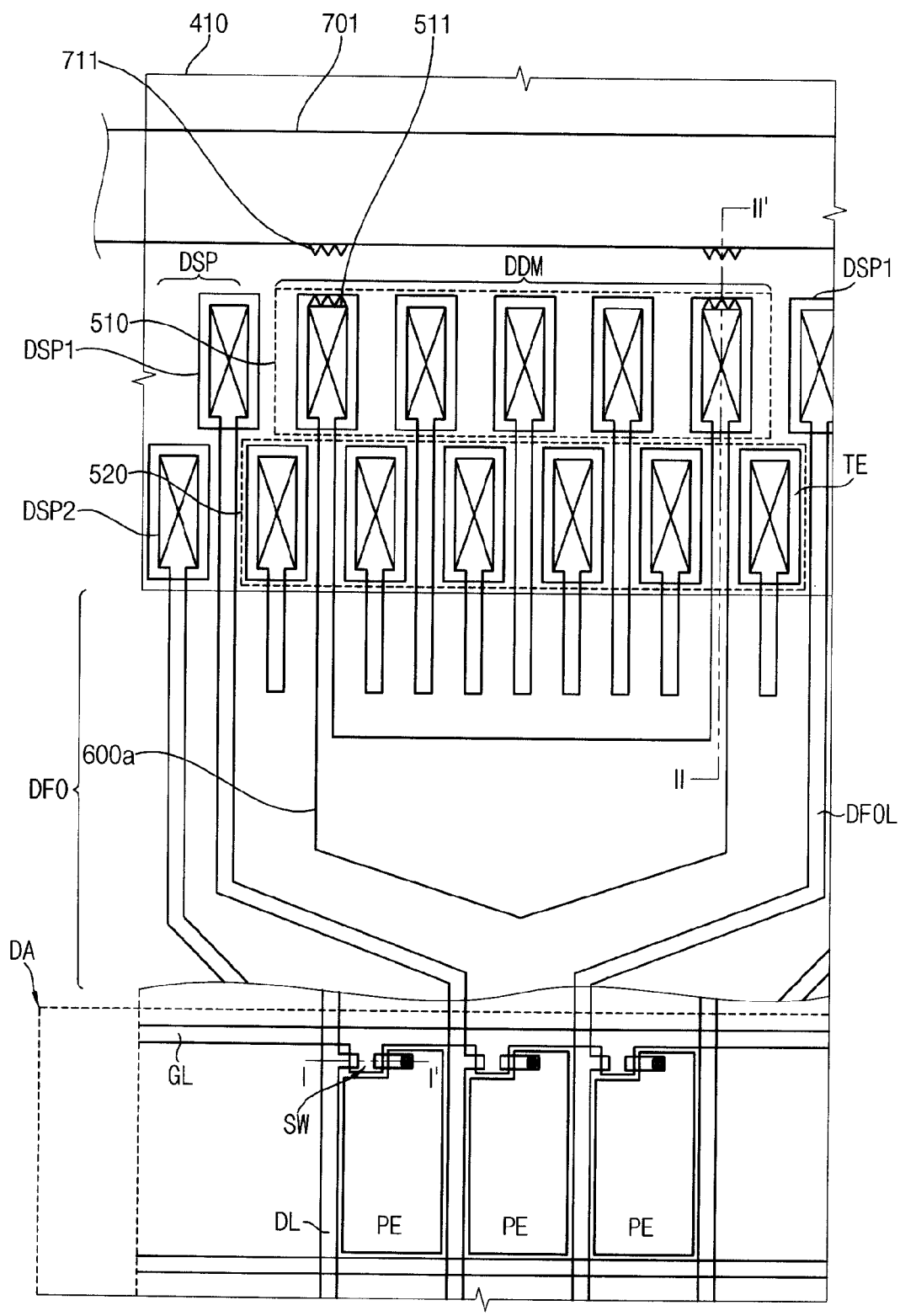
FIG. 2A is an enlarged plan view of portion 'A' in FIG. 1.
Figure 3A:
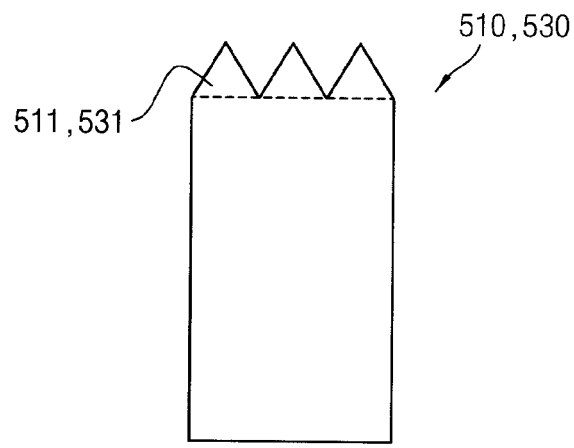
FIG. 3A, FIG. 3B, FIG. 3C, FIG. 3D, FIG. 3E, FIG. 3F, FIG. 3G, FIG. 3H and FIG. 3I are conceptual diagrams of data and gate dummy pads of FIG. 2A or FIG. 2B.
Figure 3B:
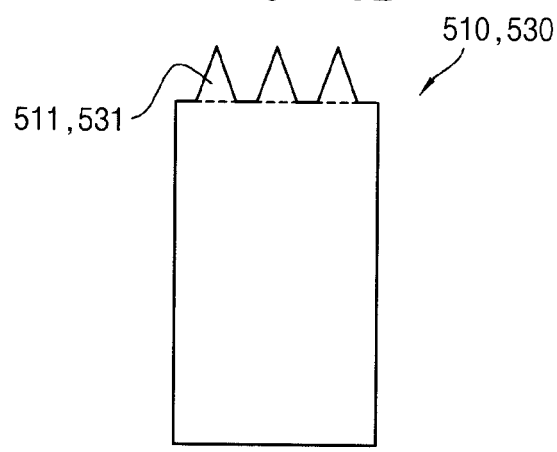
Figure 3C:
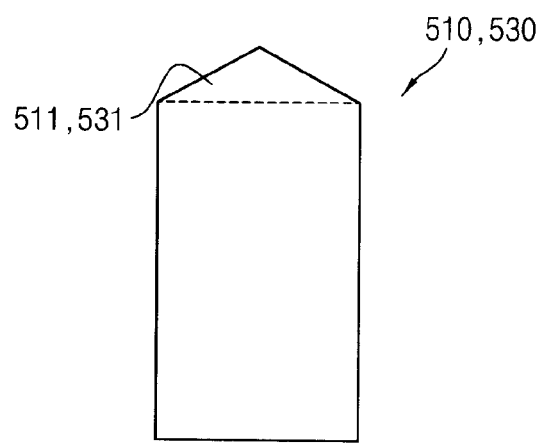
Figure 3D:
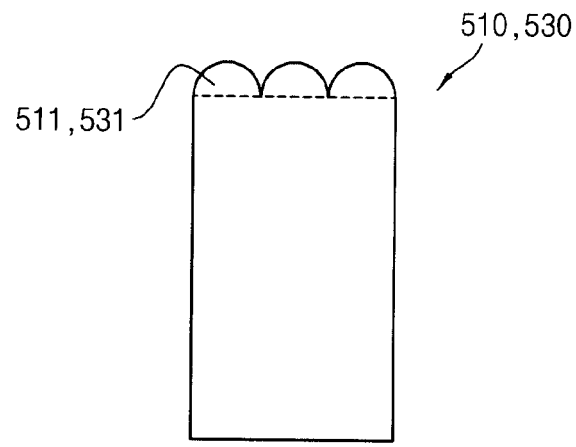
Figure 3E:
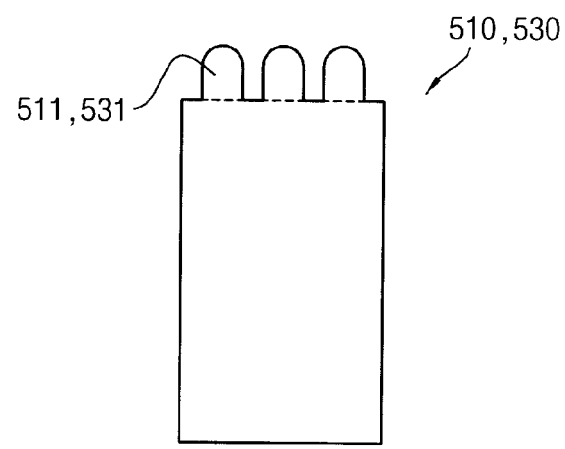
Figure 3F:
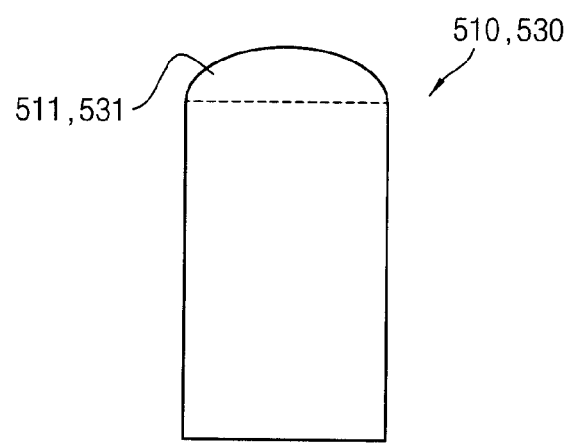
Figure 3G:
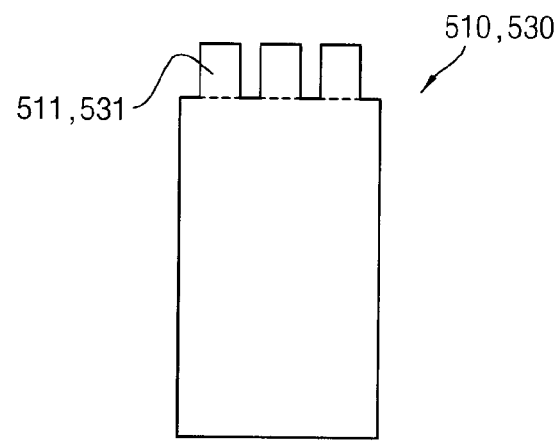
Figure 3H:
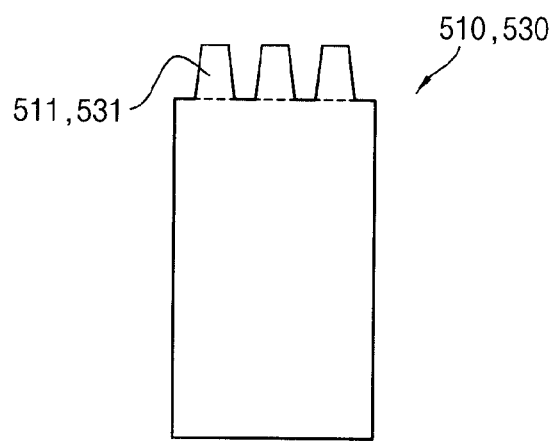
Figure 3I:
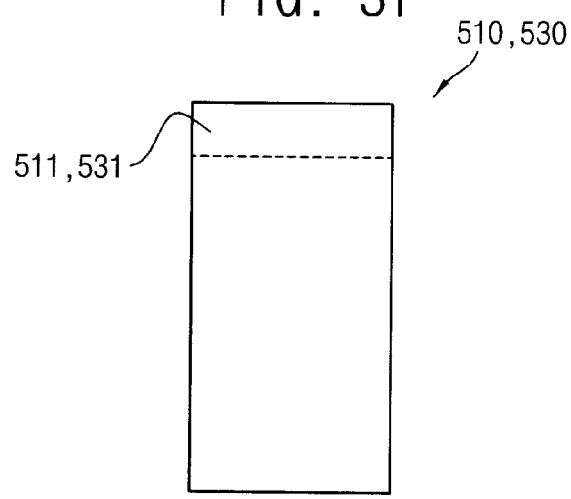
Figure 4A:
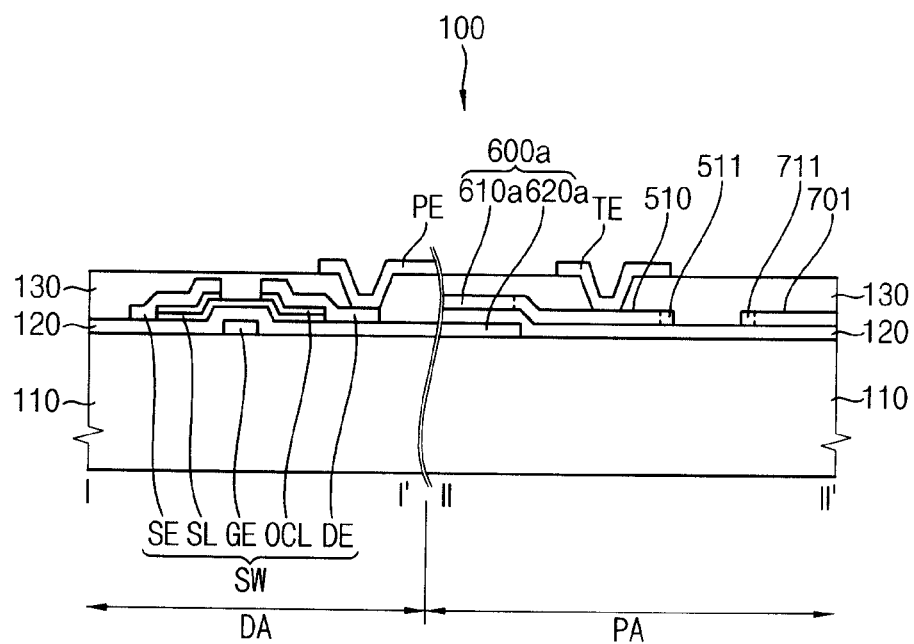
FIG. 4A is a cross-sectional view taken along lines I-I' and II-II' of FIG. 2A.
Figure 4B:
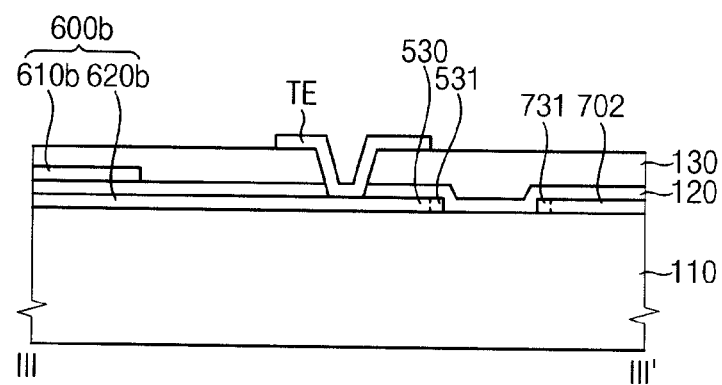
FIG. 4B is a cross-sectional view taken along line III-III' of FIG. 2B.

FIG. 1 is a plan view illustrating a display apparatus according to an example embodiment. FIG. 2A is an enlarged plan view of portion 'A' in FIG. 1, and FIG. 2B is an enlarged plan view of portion 'B' in FIG. 1. FIG. 3A, FIG. 3B, FIG. 3C, FIG. 3D, FIG. 3E, FIG. 3F, FIG. 3G, FIG. 3H and FIG. 3I are conceptual diagrams of data and gate dummy pads of FIG. 2A or FIG. 2B. FIG. 4A is a cross-sectional view taken along lines I-I' and II-II' of FIG. 2A, and FIG. 4B is a cross-sectional view taken along line III-III' of FIG. 2B.

Referring to FIG. 1, FIG. 2A, FIG. 2B, FIG. 3A, FIG. 3B, FIG. 3C, FIG. 3D, FIG. 3E, FIG. 3F, FIG. 3G, FIG. 3H, FIG. 3I, FIG. 4A and FIG. 4B, a display apparatus 1000 includes a display panel DP. The display panel DP includes an array substrate 100, an opposing substrate 200 facing the array substrate 100, and a liquid crystal layer (not shown) disposed between the array substrate 100 and the opposing substrate 200. The display panel DP includes a display area DA displaying an image and a peripheral area PA surrounding the display area DA.

The array substrate 100 includes a base substrate 110, a gate insulating layer 120 and a protective layer 130. In addition, the array substrate 100 includes gate and data lines GL and DL, a switching element SW and a pixel electrode PE which are formed in the display area DA. Furthermore, the array substrate 100 includes a fan-out portion FO, an electrostatic prevention unit 300, driving drivers 400, a signal pad portion including data signal pads DSP and gate signal pads GSP (collectively referred to as SP), dummy pad portions including first data dummy pads 510, second data dummy pads 520, first gate dummy pads 530 and second gate dummy pads 540 (collectively referred to as 500), first and second static electricity capacitors 600a and 600b and first and second driving signal output line 701 and 702 which are formed in the peripheral area PA. The array substrate 100 may further include a transparent electrode TE.

The data line DL extends along a first direction D1, and the gate line GL extends along a second direction D2 crossing the first direction D1. The gate and data lines GL and DL are disposed on different layers, so that the gate and data lines GL and DL are electrically insulated from each other. The gate and data lines GL and DL may include copper (Cu), aluminum (Al), molybdenum (Mo) or an alloy of any of these, etc. The gate and data lines GL and DL may include the same material. Alternatively, the gate and data lines GL and DL may include different materials. The switching element SW is electrically connected to the gate and data lines GL and DL. The switching element SW includes a gate electrode GE branched from the gate line GL, a source electrode SE branched from the data line DL, a drain electrode DE spaced apart from the source electrode SE, a semiconductor layer SL and an ohmic contact layer OCL. The pixel electrode PE is electrically connected to the drain electrode DE.

The fan-out portion FO includes a data fan-out portion DFO extending from the data line DL and electrically connected to a data driver 410 of the driving drivers 400, and a gate fan-out portion GFO extending from the gate line GL and electrically connected to a gate driver 420 of the driving drivers 400. The data and gate fan-out portions DFO and GFO include a plurality of data fan-out lines DFOL and a plurality of gate fan-out lines GFOL respectively.

The electrostatic prevention unit 300 is electrically connected to the fan-out portion FO. Although not shown, the electrostatic prevention unit 300 may include an electrostatic prevention diode, an electrostatic prevention transistor and an electrostatic prevention capacitor. The electrostatic prevention unit 300 dissipates and accumulates a static electricity provided through the fan-out portion FO to prevent the static electricity from flowing into the display area DA.

The driving drivers 400 include the data driver 410 electrically connected to the data fan-out portion DFO, and the gate driver 420 electrically connected to the gate fan-out portion GFO. The data and gate drivers 410 and 420 are formed using driving chips respectively. The data and gate drivers 410 and 420 are directly mounted on the base substrate 110 in a chip-on-glass (COG) mounting method, or an advanced chip-on-glass (ACOG) mounting method. Alternatively, one of the data and gate drivers 410 and 420 may be mounted in a chip-on-film (COF) method.

The signal pad portion SP includes data and gate signal pads DSP and GSP. The data signal pads DSP extend from an end section of the data fan-out portion DFO along the second direction D2, and are electrically connected to an output bump of the data driver 410, so that data signals provided through the data driver 410 are provided to the display area DA. The gate signal pads GSP extend from an end section of the gate fan-out portion GFO along the first direction D1, and are electrically connected to an output bump of the gate driver 420, so that gate signals provided through the gate driver 420 are provided to the display area DA. The signal pad portion SP may further include driving signal pads inputting driving signals to the data and gate drivers 410 and 420 for driving the data and gate drivers 410 and 420.

The data signal pads DSP may include first data signal pads DSP1 of a first row disposed relatively adjacent to the first driving signal output line 701, and second data signal pads DSP2 of a second row disposed relatively far from the first driving signal output line 701 for using a space efficiently. The first and second data signal pads DSP1 and DSP2 are disposed to form a zigzag shape. For example, each of the first data signal pads DSP1 is disposed between adjacent second data signal pads DSP2. Alternatively, the data signal pads DSP may be disposed in a line or in three or more lines. In addition, the data signal pads DSP may include the same material as the data line DL.

The gate signal pads GSP may include first gate signal pads GSP1 of a first column disposed relatively adjacent to the second driving signal output line 702, and second gate signal pads GSP2 of a second column disposed relatively far from the second driving signal output line 702 for using a space efficiently. The first and second gate signal pads GSP1 and GSP2 are disposed to form a zigzag shape. For example, each of the first gate signal pads GSP1 is disposed between the adjacent second gate signal pads GSP2. Alternatively, the gate signal pads GSP may be disposed in a line or in three or more lines. In addition, the gate signal pads GSP may include the same material as the gate line GL.

The dummy pad portion 500 may include a data dummy pad portion DDM including data dummy pads disposed parallel with the data signal pads DSP, and a gate dummy pad portion GDM including gate dummy pads disposed parallel with the gate signal pads GSP. The data dummy pad portion DDM is disposed between data signal pads DSP electrically connected to the same data driver 410. Accordingly, the data pads DSP uniformly contact the data driver 410, so that a reliability of the display panel DP may be increased. In addition, the gate dummy pad portion GDM is disposed between gate signal pads GSP electrically connected to the same gate driver 420. Accordingly, the gate pads GSP uniformly contact the gate driver 420, so that a reliability of the display panel DP may be increased.

Accordingly, the data dummy pad portion DDM may include first data dummy pads 510 of a first row disposed relatively adjacent to the first driving signal output line 701, and second data dummy pads 520 of a second row disposed relatively far from the first driving signal output line 701 as may the first and second data signal pads DSP1 and DSP2, described above. The first and second data dummy pads 510 and 520 may be disposed to form a zigzag shape. Each of the first data dummy pads 510 may be disposed between adjacent second data dummy pads 520. Alternatively, the data dummy pads may be disposed in a line or in three or more lines.

In addition, the gate dummy pad portion GDM may include first gate dummy pads 530 of a first column disposed relatively adjacent to the second driving signal output line 702, and second gate dummy pads 540 of a second column disposed relatively far from the second driving signal output line 702 as may the first and second gate signal pads GSP1 and GSP2, described above. The first and second gate dummy pads 530 and 540 may be disposed to form a zigzag shape. Each of the first gate dummy pads 530 may be disposed between adjacent second gate dummy pads 540. Alternatively, the gate dummy pads may be disposed in a line or in three or more lines.

It is desirable that the dummy pad portion 500 is insulated from the data and gate fan-out portions DFO and GFO, contrary to the data and gate signal pads DSP and GSP, which are electrically connected to the data and gate fan-out portions DFO and GFO, respectively, since the dummy pad portion 500 does not need to provide the display area DA with data or gate signals.

At least one of the first data dummy pads 510 may have a first end portion having a first data protrusion portion 511 facing the first driving signal output line 701 and protruding toward the first driving signal output line 701. The first data protrusion portion 511 includes at least one of first data protrusions. For example, the first data protrusion may have a triangle shape or a wedge shape as shown in FIG. 3A, FIG. 3B and FIG. 3C. In addition, the first data protrusion may have a round shape as shown in FIG. 3D, FIG. 3E and FIG. 3F. In addition, the first data protrusion may have a rectangular shape or a trapezoid shape as shown in FIG. 3G, FIG. 3H and FIG. 3I. Each of the first data protrusions may be disposed continuously as shown in FIGS. 3A and 3D. Alternatively, the first data protrusions may be disposed apart from each other as shown in FIGS. 3B, 3E, 3G and 3H. Alternatively, the first data protrusion may extend toward the first driving signal output line 701, so that the first data protrusion may be disposed closer to the first driving signal output line 701 than the data signal pad DSP.

Since the first data dummy pads 510 have the first data protrusion portion 511, the first data dummy pads 510 are disposed closer to the first driving signal output line 701 than the data signal pad DSP is. The first data protrusion portion 511 induces an influx of a static electricity generated from the first driving signal output line 701. A second end portion opposite to the first end portion of the first data dummy pads 510 having the first data protrusion portion 511 is electrically connected to a first electrode 610a of the first static electricity capacitor 600a. The data dummy pads 510 may include the same material as the data line DL.

At least one of the first gate dummy pads 530 may have a first end portion having a first gate protrusion portion 531 facing and spaced apart from the second driving signal output line 702 and protruding toward the second driving signal output line 702. The first gate protrusion portion 531 includes at least one first gate protrusion. For example, the first gate protrusion may have substantially the same shape as the first data protrusion as shown in FIG. 3A, FIG. 3B, FIG. 3C, FIG. 3D, FIG. 3E, FIG. 3F, FIG. 3G, FIG. 3H and FIG. 3I.

Since the first gate dummy pads 530 have the first gate protrusion portion 531, the first gate dummy pads 530 are disposed closer to the second driving signal output line 702 than the gate signal pad GSP. The first gate protrusion portion 531 induces an influx of static electricity generated from the second driving signal output line 702. A second end portion opposite to the first end portion of the first gate dummy pads 530 having the first gate protrusion portion 531 is electrically connected to a third electrode 610b of the second static electricity capacitor 600b. The gate dummy pads 530 may include the same material as the gate line GL.

The first and second static electricity capacitors 600a and 600b are disposed in the peripheral area PA between the dummy pad portion 500 and the display area DA. The first static electricity capacitor 600a is electrically connected to the first data dummy pads 510, and the second static electricity capacitor 600b is electrically connected to the first gate dummy pads 530. The first static electricity capacitor 600a includes the first electrode 610a electrically connected to the second end portion of the first data dummy pads 510 having the first data protrusion portion 511, and a second electrode 620a disposed under the first electrode 610a. The first electrode 610a includes the same material as the data line DL. Alternatively, the second electrode 620a may include the same material as the gate line GL. The first static electricity capacitor 600a accumulates static electricity provided through the first data protrusion portion 511.

The second static electricity capacitor 600b includes the third electrode 610b electrically connected to the second end portion of the first gate dummy pads 530 having the first gate protrusion portion 531, and a fourth electrode 620b disposed under the third electrode 610b. The third electrode 610b includes the same material as the data line DL. Alternatively, the fourth electrode 620b may include the same material as the gate line GL. The second static electricity capacitor 600b accumulates static electricity provided through the first gate protrusion portion 531.

The first driving signal output line 701 is electrically connected to the data drivers 410, and provides the data drivers 410 with an external signal provided through a flexible printed circuit board (not shown). The second driving signal output line 702 is electrically connected to the gate drivers 420, and provides the gate drivers 420 with an external signal provided through a flexible printed circuit board (not shown). Each of the first and second driving signal output lines 701 and 702 may be one of a power source line, a data driving signal output line and a gate driving signal output line.

According to example embodiments shown in FIG. 1, FIG. 2A and FIG. 2B, each of the first and second driving signal output lines 701 and 702 is a power source line.

Since the data and gate drivers 410 and 420 are directly mounted on the base substrate 110, the first and second driving signal output lines 701 and 702 are directly mounted on the base substrate 110. The first and second driving signal output lines 701 and 702 are disposed adjacent to the data and gate signal pads DSP and GSP for using space efficiently, and provide a plurality of the data drivers 410 and a plurality of the gate drivers 420, respectively, with a power source voltage according to a cascade method. Alternatively, the first and second driving signal output lines 701 and 702 may directly provide a plurality of the data drivers 410 and a plurality of the gate drivers 420, respectively, with the power source voltage. The first and second driving signal output lines 701 and 702 may include copper (Cu), aluminum (Al), molybdenum (Mo) or an alloy of any of these, etc.

When the first and second driving signal output lines 701 and 702 are directly mounted on the base substrate 110, a resistance of each of the first and second driving signal output lines 701 and 702 is greater than when the first and second driving signal output lines 701 and 702 are mounted on a tape. Thus, a voltage drop occurs, and the voltage drop interferes with uniformly displaying an image on the display panel DP. However, the voltage drop may be prevented when a width of each of the first and second driving signal output lines 701 and 702 is increased.

The first driving signal output line 701 includes a second data protrusion portion 711 protruding toward the first data protrusion portion 511, and the second driving signal output line 702 includes a second gate protrusion portion 731 protruding toward the first gate protrusion portion 531. The second data protrusion portion 711 faces and is spaced apart from the first data protrusion portion 511, and the second gate protrusion portion 731 faces and is spaced apart from the first gate protrusion portion 531. Accordingly, by increasing the formed width of the first driving signal output line 701, static electricity provided through the first driving signal output line 701 during a process of manufacturing the display panel DP is induced to flow not into the data signal pads DSP, but rather, into the first data dummy pads 510 having the first data protrusion portion 511. In addition, by increasing the formed width of the second driving signal output line 702, static electricity provided through the second driving signal output line 702 during a process of manufacturing the display panel DP is induced to flow not into the gate signal pads GSP, but rather, into the first gate dummy pads 530 having the first gate protrusion portion 531.

Alternatively, the second data and gate protrusion portions 711 and 731 may be omitted. Even if the second data and gate protrusion portions 711 and 731 are omitted, static electricity provided through each of the first and second driving signal output lines 701 and 702 may be induced to flow into the first data and gate dummy pads 510 and 530, respectively, by each of the first data and gate protrusion portions 511 and 531, respectively.

The transparent electrode TE is disposed on the data and gate signal pads DSP and GSP, the first and second data dummy pads 510 and 520 and the first and second gate dummy pads 530 and 540, and is electrically connected to the data and gate signal pads DSP and GSP, the first and second data dummy pads 510 and 520 and the first and second gate dummy pads 530 and 540. The transparent electrode TE increases the contact areas between the output bumps of the data and gate drivers 410 and 420 and the corresponding data and gate signal pads DSP and GSP, between the output bump of the data drivers 410 and the corresponding first and second data dummy pads 510 and 520, and between the output bump of the gate driver 420 and the corresponding first and second gate dummy pads 530 and 540. The transparent electrode TE may include indium-tin-oxide (ITO) or the like, as the pixel electrode PE.

FIG. 5A, FIG. 5B, FIG. 6A, FIG. 6B, FIG. 7A and FIG. 7B are cross-sectional views illustrating an example embodiment of a method of manufacturing the array substrate of the display apparatus shown in FIG. 1.

Figure 5A:
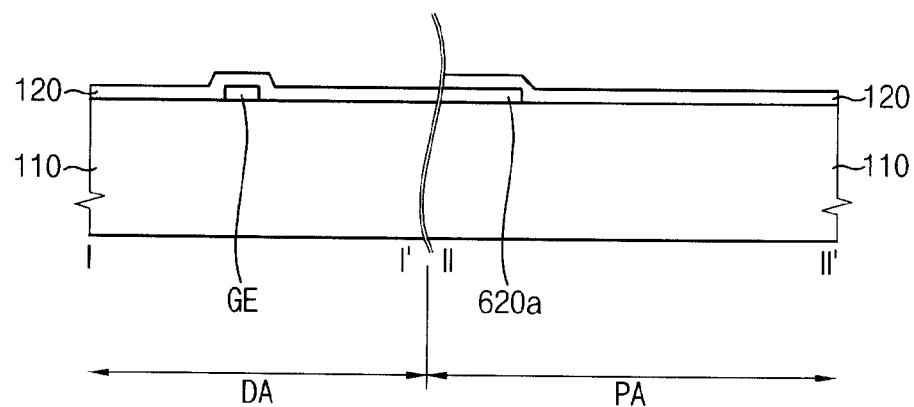
FIG. 5A, FIG. 5B, FIG. 6A, FIG. 6B, FIG. 7A and FIG. 7B are cross-sectional views illustrating a method of manufacturing the array substrate of the display apparatus shown in FIG. 1.
Figure 5B:
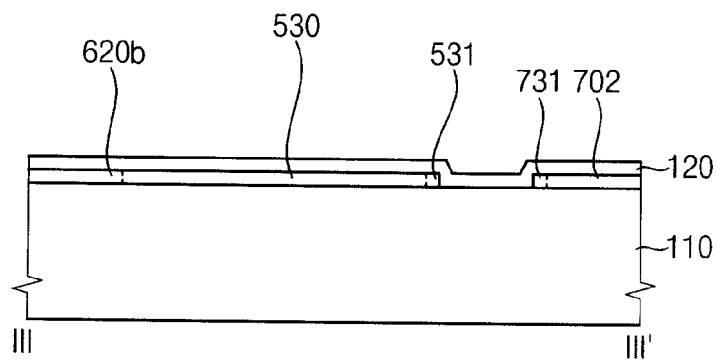

Referring to FIGS. 5A and 5B, a gate metal layer is disposed on the base substrate 110, and a gate pattern is formed by patterning the gate metal layer. The gate pattern may include a gate electrode GE, a gate line GL, a second electrode 620a of a first static electricity capacitor 600a, a fourth electrode 620b of a second static electricity capacitor 600b, a first gate dummy pad 530 electrically connected to the fourth electrode 620b, a first gate signal pad GSP1 disposed adjacent to the first gate dummy pad 530, a second driving signal output line 702 disposed adjacent to the first gate dummy pad 530 and additional gate signal pads GSP, etc. A gate insulating layer 120 is disposed on the base substrate 110 on which the gate pattern is disposed.

Figure 6A:
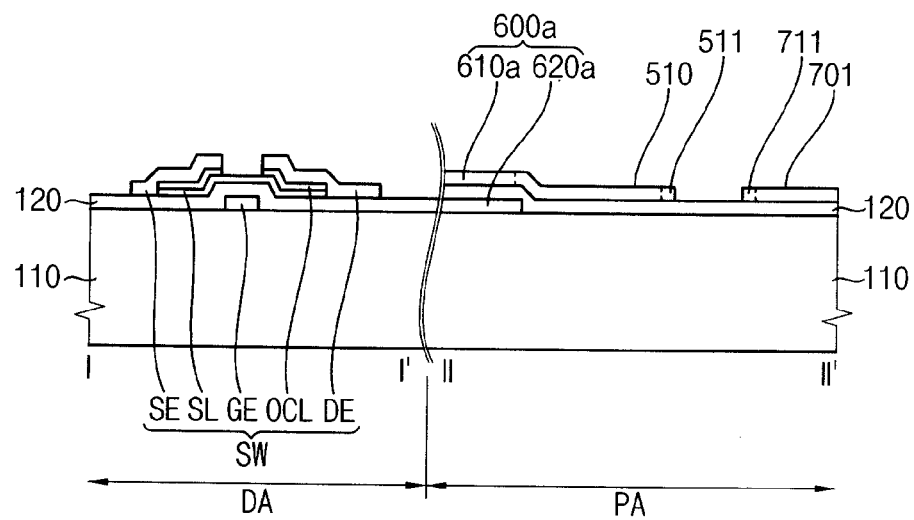
Figure 6B:
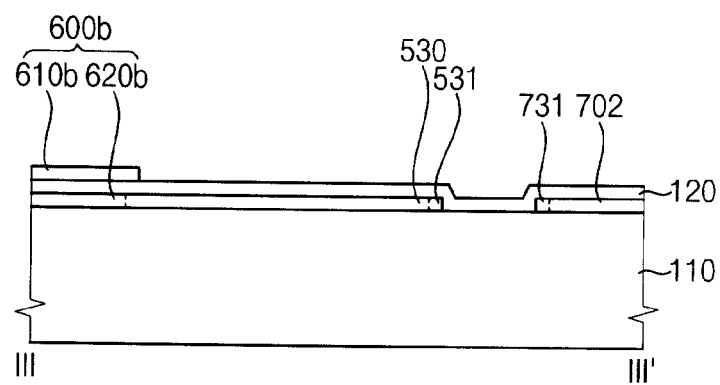

Referring to FIGS. 6A and 6B, a semiconductor layer SL and an ohmic contact layer OCL are disposed on the gate insulating layer 120 and patterned. A data metal layer is disposed on the gate insulating layer 120, on which the semiconductor layer SL and the ohmic contact layer OCL are disposed, and a data pattern is formed by patterning the data metal layer. The data pattern may include source and drain electrodes SE and DE, a data line DL, a first electrode 610a of a first static electricity capacitor 600a, a third electrode 610b of a second static electricity capacitor 600b, a first data dummy pad 510 electrically connected to the first electrode 610a, a first data signal pad DSP1 disposed adjacent to the first data dummy pad 510, a first driving signal output line 701 disposed adjacent to the first data dummy pad 510 and additional data signal pads DSP, etc.

The data dummy pad portion DDM includes a first data dummy pad 510 disposed adjacent to the first driving signal output line 701, and a second data dummy pad 520 disposed relatively far from the first driving signal output line 701 compared to the first dummy pad 510. The first data dummy pad 510 of the data dummy pad portion DDM is disposed on the same layer, on which the first driving signal output line 701 is disposed, and a first end portion of the first data dummy pad 510 is formed to be spaced apart from and to face the first driving signal output line 701. A first data protrusion portion 511 protruding toward the first driving signal output line 701 is formed at the first end portion of the first data dummy pad 510, and a second data protrusion portion 711 is formed at the first driving signal output line 701 spaced apart from and facing the first data protrusion portion 511.

The gate dummy pad portion GDM includes a first gate dummy pad 530 disposed adjacent to the second driving signal output line 702, and a second gate dummy pad 540 disposed farther away from the second driving signal output line 702 than the first gate dummy pad 530. The first gate dummy pad 530 of the gate dummy pad portion GDM is disposed on the same layer, on which the second driving signal output line 702 is disposed, and a first end portion of the first gate dummy pad 530 is formed to be spaced apart from and to face the second driving signal output line 702. A first gate protrusion portion 531 protruding toward the second driving signal output line 702 is formed at the first end portion of the first gate dummy pad 530, and a second gate protrusion portion 731 is formed at the second driving signal output line 702 spaced apart from and facing the first gate protrusion portion 531.

Figure 7A:
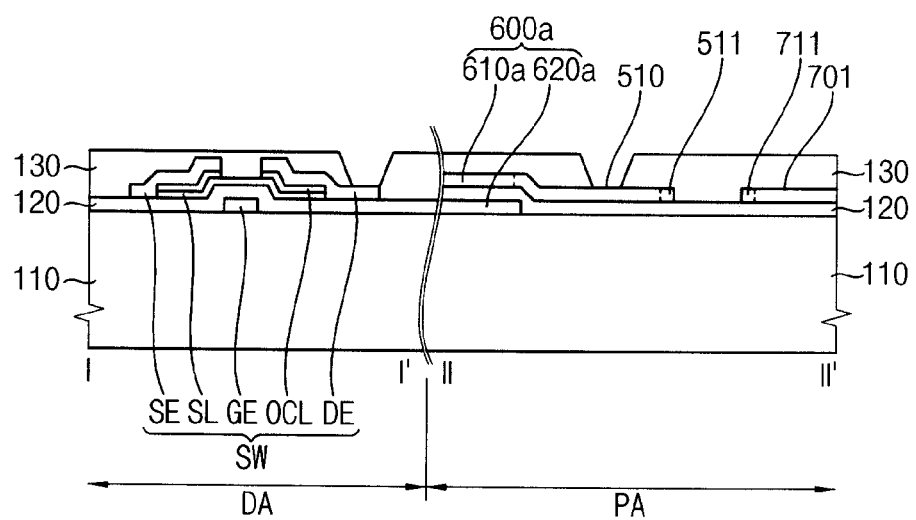
Figure 7B:
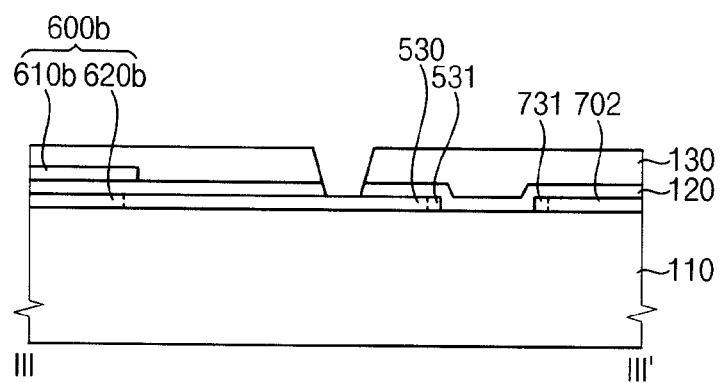

Referring to FIGS. 7A and 7B, a protective layer 130 is disposed on the gate insulating layer 120 on which the data pattern is formed. The protective layer 130 may be a single layer. Alternatively, the protective layer 130 may be a multiple layer. Using a mask having a transmitting portion and a blocking portion, the protective layer 130 is patterned. When the protective layer 130 is a positive type, the transmitting portion corresponds to the drain electrode DE, the data signal pads DSP, the first and second data dummy pads 510 and 520, the gate signal pads GSP and the first and second gate dummy pads 530 and 540. Alternatively, when the protective layer 130 is a negative type, the blocking portion corresponds to the drain electrode DE, the data signal pads DSP, the first and second data dummy pads 510 and 520, the gate signal pads GSP and the first and second gate dummy pads 530 and 540. The protective layer 130 is patterned, so that at least a portion of the drain electrode DE, the data signal pads DSP, the first and second data dummy pads 510 and 520, the gate signal pads GSP and the first and second gate dummy pads 530 and 540 may be exposed.

Referring to FIGS. 4A and 4B, a transparent conductive material such as indium-tin-oxide (ITO) is disposed on the protective layer 130 exposing at least a portion of the drain electrode DE, the data signal pads DSP, the first and second data dummy pads 510 and 520, the gate signal pads GSP and the first and second gate dummy pads 530 and 540. The transparent conductive material layer is patterned to form a pixel electrode PE electrically connected to the drain electrode DE and a transparent electrode TE electrically connected to the data signal pads DSP, the first and second data dummy pads 510 and 520, the gate signal pads GSP and the first and second gate dummy pads 530 and 540, and thus, an array substrate 100 of the display panel DP is formed.

According to the example embodiments of the display apparatus and the method of manufacturing the display apparatus shown in FIG. 1 FIG. 2A, FIG. 2B, FIG. 3A, FIG. 3B, FIG. 3C, FIG. 3D, FIG. 3E, FIG. 3F, FIG. 3G, FIG. 3H, FIG. 3I, FIG. 4A, FIG. 4B, FIG. 5A, FIG. 5B, FIG. 6A, FIG. 6B, FIG. 7A and FIG. 7B, the first data dummy pad 510 disposed adjacent to the first driving signal output line 701 has a first data protrusion portion 511 protruding toward the first driving signal output line 701, and the first gate dummy pad 530 disposed adjacent to the second driving signal output line 702 has a first gate protrusion portion 531 protruding toward the second driving signal output line 702, so that static electricity provided through the first and second driving signal output lines 701 and 702 may be induced to flow into the first data dummy pad 510 and the first gate dummy pad 530, respectively. Accordingly, damage of a switching element SW of the display area DA electrically connected to the data and gate signal pads DSP and GSP may be prevented.

In addition, the first driving signal output line 701 has a second data protrusion portion 711 spaced apart from and facing the first data protrusion portion 511, so that static electricity may be easily flowed into the first data dummy pad 510 having the first data protrusion portion 511.

In addition, the second driving signal output line 702 has a second gate protrusion portion 731 spaced apart from and facing the first gate protrusion portion 531, so that static electricity may be easily flowed into the first gate dummy pad 530 having the first gate protrusion portion 531.

Figure 8:
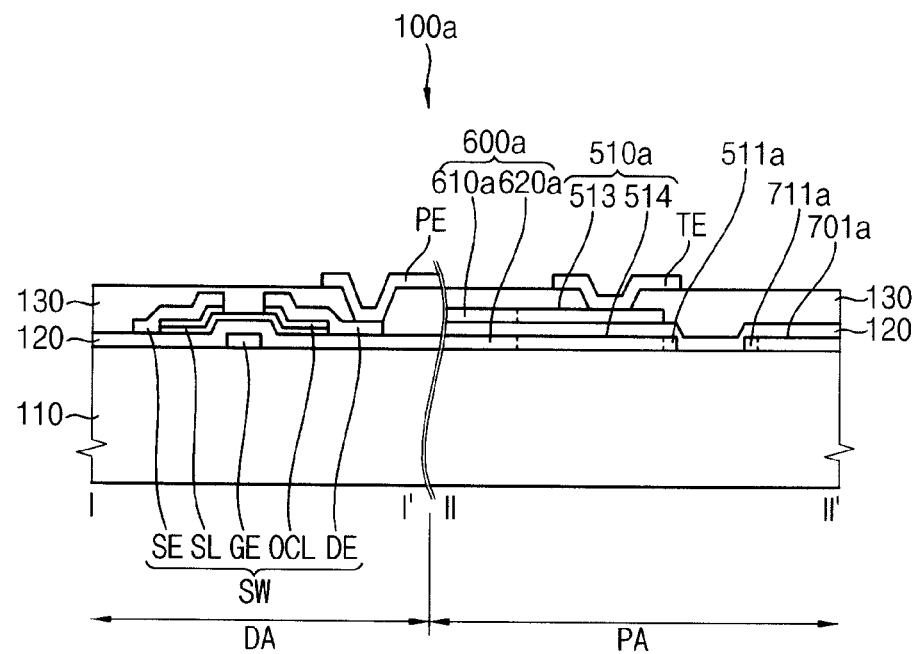
FIG. 8 is a cross-sectional view illustrating a display apparatus according to another example embodiment.

FIG. 8 is a cross-sectional view illustrating a display apparatus according to another example embodiment.

The display apparatus according to the example embodiment shown in FIG. 8 is substantially the same as the display apparatus according to the example embodiment shown in FIG. 1, FIG. 2A, FIG. 2B, FIG. 3A, FIG. 3B, FIG. 3C, FIG. 3D, FIG. 3E, FIG. 3F, FIG. 3G, FIG. 3H, FIG. 3I, FIG. 4A and FIG. 4B, except for a first protrusion portion and driving signal output lines. Accordingly, the same reference numerals will be used to refer to the same or like parts as those described in FIGS. 1 to 4B and any further repetitive explanation concerning the above elements will be omitted.

Referring to FIG. 8, an array substrate 100a of the display apparatus includes a base substrate 110. In addition, the array substrate 100a includes gate and data lines GL and DL, a switching element SW, and a pixel electrode PE, which are formed in the display area DA. Furthermore, the array substrate 100a includes a fan-out portion FO, an electrostatic prevention unit 300, driving drivers 400, a signal pad portion SP, a data dummy pad portion DDM, a first static electricity capacitor 600a and a first driving signal output line 701a. The array substrate 100a may further include a transparent electrode TE.

The data dummy pad portion DDM includes a first data dummy pad 510a disposed adjacent to the first driving signal output line 701a, and a second data dummy pad 520a disposed farther from the first driving signal output line 701a than the first data dummy pad 510a. Each of the first and second data dummy pads 510a and 520a includes first and second data dummy electrodes 513 and 514. The first data dummy electrode 513 is disposed on the second data dummy electrode 514, so that each of the first and second data dummy pads 510a and 520a has a dual-layer structure. The first data dummy electrode 513 includes the same data metal material as source and drain electrodes SE and DE of the switching element SW and the data line DL, and the second data dummy electrode 514 includes the same gate metal material as a gate electrode GE of the switching element SW and the gate line GL.

The first data dummy electrodes 513 of the first data dummy pads 510a are electrically connected to a first electrode 610a of the first static electricity capacitor 600a.

At least one of the second data dummy electrodes 514 of the first data dummy pads 510a have a first end portion having a first data protrusion portion 511a protruding toward the first driving signal output line 701a, and spaced apart from and facing the first driving signal output line 701a. The first data protrusion portion 511a includes at least one of first protrusions. The first protrusion may have various shapes such as shown in FIG. 3A, FIG. 3B, FIG. 3C, FIG. 3D, FIG. 3E, FIG. 3F, FIG. 3G, FIG. 3H and FIG. 3I. Accordingly, the first data protrusion portion 511a is disposed closer to the first driving signal output line 701a than a data signal pad DSP is, and static electricity generated from the first driving signal output line 701a is induced to flow into the first data dummy pads 510a. A second end portion opposite to the first end portion of the second data dummy electrode 514 having the first data protrusion portion 511a is electrically connected to a second electrode 620a of the first static electricity capacitor 600a.

The first driving signal output line 701a includes a second data protrusion portion 711a protruding toward the first data protrusion portion 511a. The second data protrusion portion 711a is formed in the width direction spaced apart from and facing the first data protrusion portion 511a. Accordingly, when forming the first driving signal output lines 701a with an increased width to avoid a voltage drop, static electricity provided through the first driving signal output lines 701a during the process of manufacturing the display panel DP is induced to flow into the first data dummy pads 510a having the first data protrusion portion 511 by the second data protrusion portion 711a instead of into the data signal pads DSP. Alternatively, the second data protrusion 711a may be omitted. Even if the second data protrusion portion 711a is omitted, static electricity provided through the first driving signal output lines 701a may be induced to flow into the first data dummy pads 510a by the first data protrusion portions 511a.

The transparent electrode TE is disposed on the data signal pads DSP and the first and second data dummy pads 510a and 520a, and is electrically connected to the data signal pads DSP and the first and second data dummy pads 510a and 520a. According to the example embodiment shown in FIG. 8, the transparent electrode TE is electrically connected to the first data dummy electrodes 513 of the first and second data dummy pads 510a and 520a.

In the example embodiment shown in FIG. 8, only the data dummy pads DDM have dual layer structures, however, each of the data signal pads DSP disposed adjacent to the data dummy pads DDM, and the first driving signal output line 701a may have a dual layer structure. Each of the data signal pads DSP and the first driving signal output line 701a may have a dual layer structure, so that a voltage drop thereof may be prevented.

Figure 9A:
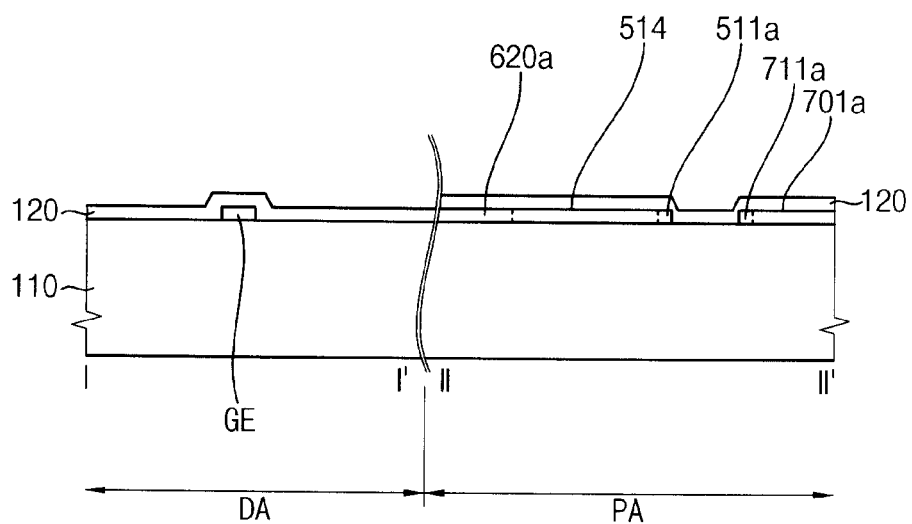
FIG. 9A, FIG. 9B and FIG. 9C are cross-sectional views illustrating a method of manufacturing the array substrate of the display apparatus shown in FIG. 8.
Figure 9B:
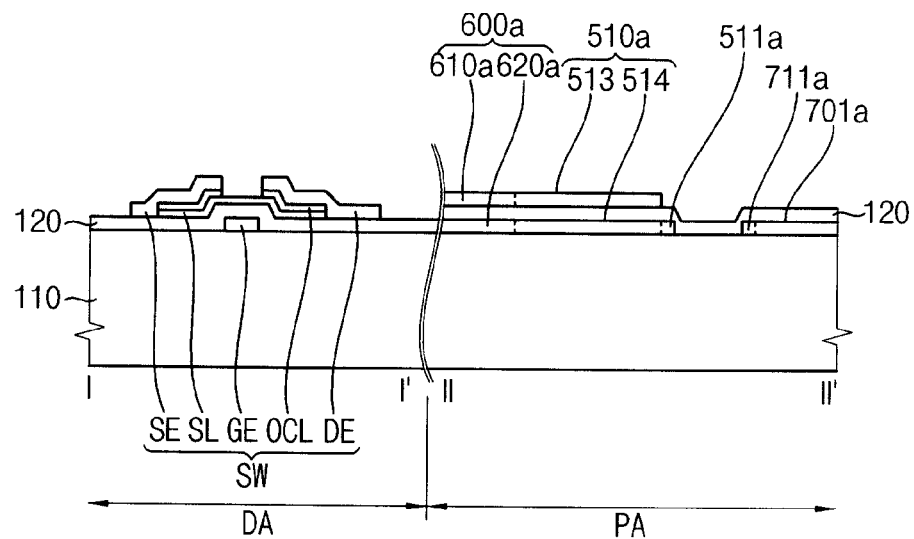
Figure 9C:
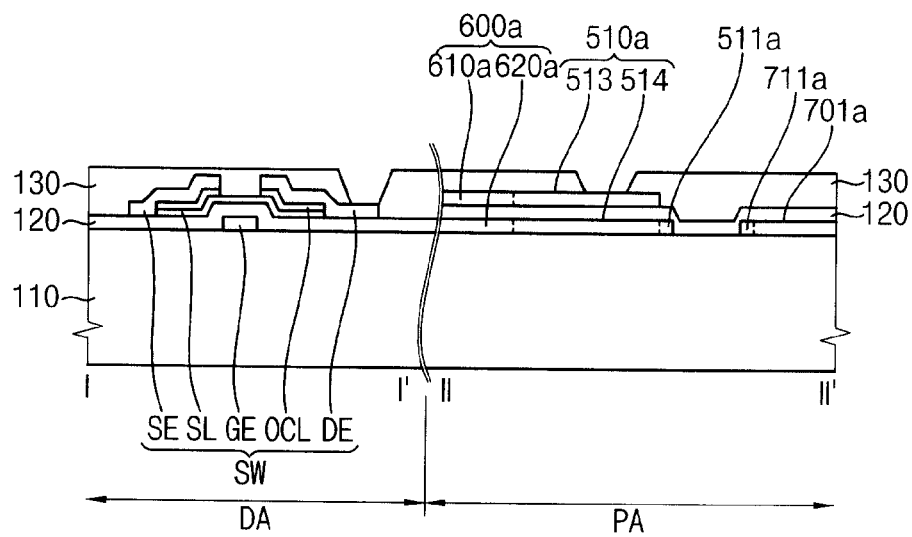

FIG. 9A, FIG. 9B and FIG. 9C are cross-sectional views illustrating an example embodiment of a method of manufacturing the array substrate of the display apparatus shown in FIG. 8.

Referring to FIG. 9A, a gate metal layer is disposed on the base substrate 110, and a gate pattern is formed by patterning the gate metal layer. The gate pattern may include a gate electrode GE, a gate line GL, a second electrode 620a of a first static electricity capacitor 600a, a second dummy electrode 514 of the first data dummy pad 510a electrically connected to the second electrode 620a, a first driving signal output line 701a disposed adjacent to the second dummy electrode 514 and a gate signal pad GSP, etc. A gate insulating layer 120 is disposed on the base substrate 110 on which the gate pattern is disposed.

Referring to FIG. 9B, a semiconductor layer SL and an ohmic contact layer OCL are disposed on the gate insulating layer 120, and are patterned. A data metal layer is disposed on the gate insulating layer 120, on which the semiconductor layer SL and the ohmic contact layer OCL are disposed, and a data pattern is formed by patterning the data metal layer. The data pattern may include source and drain electrodes SE and DE, a data line DL, a first electrode 610a of a first static electricity capacitor 600a, a first data dummy electrode 513 of the first data dummy pad 510a electrically connected to the first electrode 610a, a data signal pad DSP disposed adjacent to the first data dummy pad 510a, etc. The second data dummy electrode 514 of the first data dummy pad 510a is disposed on the same layer, on which the first driving signal output line 701a is disposed, and a first end portion of the second data dummy electrode 514 of the first data dummy pad 510a is formed to face the first driving signal output line 701a. A first data protrusion portion 511a protruding toward the first driving signal output line 701a is disposed on the first end portion of the second data dummy electrode 514 of the first data dummy pad 510a, and a second data protrusion portion 711a is disposed on the first driving signal output line 701a facing the first data protrusion portion 511a.

Referring to FIG. 9C, a protective layer 130 is disposed on the gate insulating layer 120 on which the data pattern is formed. The protective layer 130 is patterned, so that at least a portion of the drain electrode DE, the data signal pads DSP and the first data dummy electrodes 513 of the first and second data dummy pads 510a and 520a may be exposed.

Referring to FIG. 8, a pixel electrode PE electrically connected to the drain electrode DE, and a transparent electrode TE electrically connected to the data signal pads DSP and the first data dummy electrodes 513 of the first and second data dummy pads 510a and 520a are disposed on the base substrate, on which the protective layer 130 is disposed, and an array substrate 100a of the display panel DP is formed.

According to the example embodiments of the display apparatus and the method of manufacturing the array substrate of the display apparatus shown in FIG. 8, FIG. 9A, FIG. 9B and FIG. 9C, the second data dummy electrode 514 of the first data dummy pad 510a disposed adjacent to the first driving signal output line 701a has the first data protrusion portion 511a protruding toward the first driving signal output line 701a, and static electricity provided through the first driving signal output lines 701a is induced to flow into the first data dummy pads 510a, so that static electricity may be prevented from flowing into the data signal pads DSP. Accordingly, damage of a switching element SW of the display area DA electrically connected to the data signal pads DSP may be prevented.

In addition, the first driving signal output line 701a has the second data protrusion portion 711a spaced apart from and facing the first data protrusion portion 511a, so that static electricity may easily flow into the first data dummy pad 510a having the first data protrusion portion 511a.

According to the present example embodiment, only the data dummy pads are described, however, gate dummy pads as well as the data dummy pads may be formed in the same method.

Figure 10:
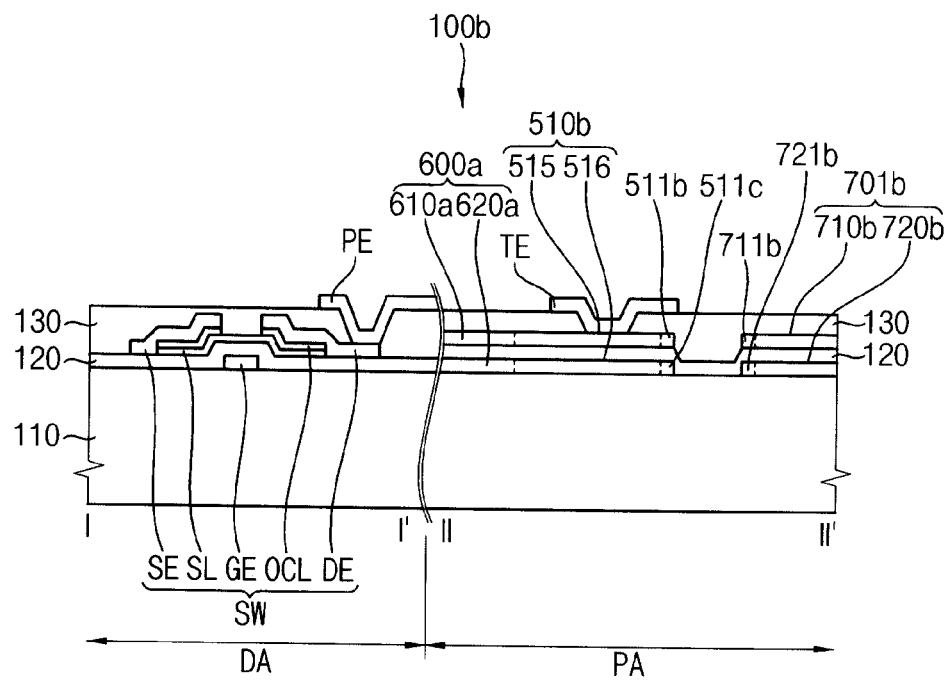
FIG. 10 is a cross-sectional view illustrating a display apparatus according to still another example embodiment.

FIG. 10 is a cross-sectional view illustrating a display apparatus according to still another example embodiment.

The display apparatus according to the example embodiment shown in FIG. 10 is substantially the same as the display apparatus according to the example embodiment shown in FIG. 1, FIG. 2A, FIG. 2B, FIG. 3A, FIG. 3B, FIG. 3C, FIG. 3D, FIG. 3E, FIG. 3F, FIG. 3G, FIG. 3H, FIG. 3I, FIG. 4A and FIG. 4B, except for a first protrusion portion and driving signal output lines. Accordingly, the same reference numerals will be used to refer to the same or like parts as those described in FIGS. 1 to 4B and any further repetitive explanation concerning the above elements will be omitted.

Referring to FIG. 10, an array substrate 100b of the display apparatus includes a base substrate 110. In addition, the array substrate 100b includes gate and data lines GL and DL, a switching element SW and a pixel electrode PE which are formed in the display area DA. Furthermore, the array substrate 100b includes a fan-out portion FO, an electrostatic prevention unit 300, driving drivers 400, a signal pad portion SP, a dummy pad portion including a data dummy pad portion DDM and a gate dummy pad portion GDM, a first static electricity capacitor 600a and a first driving signal output line 701b. The array substrate 100b may further include a transparent electrode TE.

The dummy pad portion includes data and gate dummy pad portions DDM and GDM. The data dummy pad portion DDM includes a first data dummy pad 510b disposed adjacent to the first driving signal output line 701b, and a second data dummy pad 520b disposed relatively farther from the first driving signal output line 701b than the first data dummy pad 510b. Each of the first and second data dummy pads 510b and 520b includes first and second data dummy electrodes 515 and 516. The first data dummy electrode 515 is disposed on the second data dummy electrode 516, so that each of the first and second data dummy pads 510b and 520b has a dual-layer structure. The first data dummy electrode 515 may include the same data metal material as source and drain electrodes SE and DE of the switching element SW and the data line DL, and the second data dummy electrode 516 may include the same gate metal material as a gate electrode GE of the switching element SW and the gate line GL.

At least one of the first data dummy electrodes 515 of the first data dummy pads 510b has a first end portion having a first data protrusion portion 511b protruding toward a first output line 710b of the first driving signal output line 701b, and spaced apart from and facing the first output line 710b of the first driving signal output line 701b. The first data protrusion portion 511b includes at least one of first protrusions. The first protrusion may have various shapes such as shown in FIG. 3A, FIG. 3B, FIG. 3C, FIG. 3D, FIG. 3E, FIG. 3F, FIG. 3G, FIG. 3H and FIG. 3I. Accordingly, the first data protrusion portion 511b is disposed closer to the first driving signal output line 701b than a data signal pad DSP is, so that static electricity generated from the first driving signal output line 701b is induced to flow into the first data dummy pads 510b. A second end portion opposite to the first end portion of the first data dummy electrode 515 having the first data protrusion portion 511b is electrically connected to a first electrode 610a of the first static electricity capacitor 600a.

At least one of the second data dummy electrodes 516 of the first data dummy pads 510b has a first end portion having a second data protrusion portion 511c protruding toward a second output line 720b of the first driving signal output line 701b, and spaced apart from and facing the second output line 720b of the first driving signal output line 701b. The second data protrusion portion 511c includes at least one of first protrusions. The first protrusion may have various shapes such as shown in FIGS. 3A to 3I. Accordingly, the first data protrusion portion 511c is disposed closer to the first driving signal output line 701b than a data signal pad DSP is, so that static electricity generated from the first driving signal output line 701b is induced to flow into the first data dummy pads 510b. A second end portion opposite to the first end portion of the second data dummy electrode 516 having the second data protrusion portion 511c is electrically connected to a second electrode 620a of the first static electricity capacitor 600a.

The first driving signal output line 701b includes the first and second output lines 710b and 720b. The first output line 710b is disposed on the second output line 720b, so that the first driving signal output line 701b has a dual-layer structure. The first output line 710b as well as the data dummy electrode 515 may include the same data metal material as source and drain electrodes SE and DE of the switching element SW and the data line DL, and the second output line 720b as well as the second data dummy electrode 516 may include the same gate metal material as a gate electrode GE of the switching element SW and the gate line GL.

The first output line 710b may have a third data protrusion portion 711b protruding toward the first data protrusion portion 511b, and the second output line 720b may have a fourth data protrusion portion 721b protruding toward the second data protrusion portion 511c. Accordingly, by widely forming the width of the first driving signal output line 701b, static electricity provided through the first and second output lines 710b and 720b during a process of manufacturing the display panel DP is induced to flow into the first data dummy pads 510b having the first or second data protrusion portion 511b or 511c by the third and fourth data protrusion portions 711b and 721b and not into the data signal pads DSP.

Alternatively, the third and fourth data protrusion portions 711b and 721b may be omitted. Even if the third and fourth data protrusion portions 711b and 721b are omitted, static electricity provided through the first driving signal output line

701b may be induced to flow into the first data dummy pads 510b by the first and second data protrusion portions 511b and 511c.

The transparent electrode TE is disposed on the data signal pads DSP and the first and second data dummy pads 510b and 520b, and is electrically connected to the data signal pads DSP and the first and second data dummy pads 510b and 520b. According to the example embodiment shown in FIG. 10, the transparent electrode TE is electrically connected to the first data dummy electrodes 515 of the first and second data dummy pads 510b and 520b.

Figure 11A:
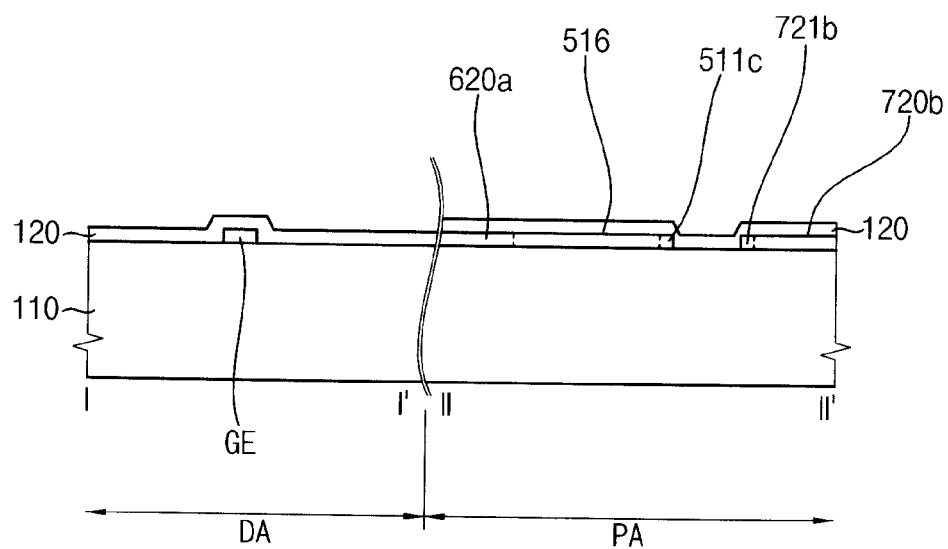
FIG. 11A, FIG. 11B and FIG. 11C are cross-sectional views illustrating a method of manufacturing the array substrate of the display apparatus shown in FIG. 10.
Figure 11B:
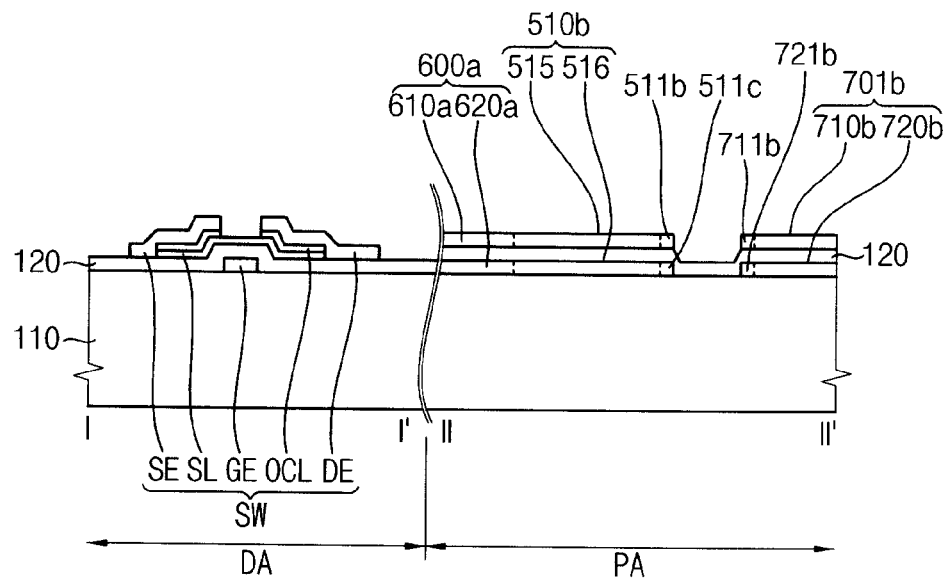
Figure 11C:
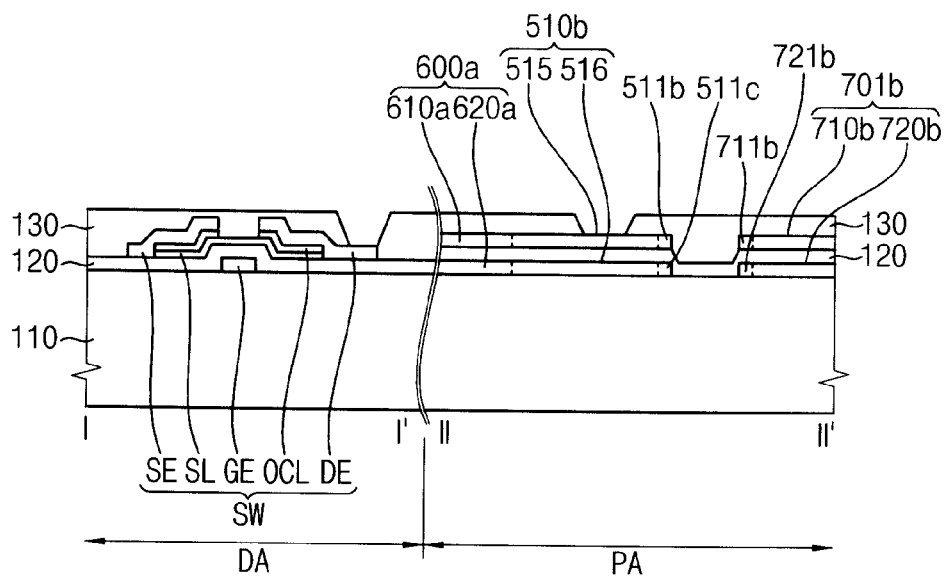

FIG. 11A, FIG. 11B and FIG. 11C are cross-sectional views illustrating a method of manufacturing the array substrate of the display apparatus shown in FIG. 10.

Referring to FIG. 11A, a gate metal layer is disposed on the base substrate 110, and a gate pattern is formed by patterning the gate metal layer. The gate pattern may include a gate electrode GE, a gate line GL, a second electrode 620a of a first static electricity capacitor 600a, a second data dummy electrode 516 of a first data dummy pad 510b electrically connected to the second electrode 620a, a second output line 720b of a first driving signal output line 701b disposed adjacent to the second data dummy electrode 516 and a gate signal pad GSP, etc.

The second data dummy electrode 516 of the first data dummy pad 510b is disposed on the same layer, on which the second output line 720b is disposed, and a first end portion of the first data dummy pad 510b is formed spaced apart from and to face the second output line 720b. A second data protrusion portion 511c protruding toward the second output line 720b is disposed on the first end portion of the second data dummy electrode 516 of the first data dummy pad 510b, and a fourth data protrusion portion 721b is disposed on the second output line 720b facing the second data protrusion portion 511c. A gate insulating layer 120 is disposed on the base substrate 110 on which the gate pattern is formed.

Referring to FIG. 11B, a semiconductor layer SL and an ohmic contact layer OCL are disposed on the gate insulating layer 120, and are patterned. A data metal layer is disposed on the gate insulating layer 120, on which the semiconductor layer SL and the ohmic contact layer OCL are disposed, and a data pattern is formed by patterning the data metal layer. The data pattern may include source and drain electrodes SE and DE, a data line DL, a first electrode 610a of a first static electricity capacitor 600a, a first data dummy electrode 515 of the first data dummy pad 510b electrically connected to the first electrode 610a, a first output line 710b of the first driving signal output line 701b disposed adjacent to the first data dummy electrode 515, a data signal pad DSP disposed adjacent to the first data dummy pad 510b, etc.

The first data dummy electrode 515 of the first data dummy pad 510b is disposed on the same layer, on which the first output line 710b is disposed, and the first end portion of the first data dummy electrode 515 is formed spaced apart from and to face the first output line 710b. A first data protrusion portion 511b protruding toward the first output line 710b is disposed on the first end portion of the first data dummy electrode 515 of the first data dummy pad 510b, and a third data protrusion portion 711b is disposed on the first output line 710b spaced apart from and facing the first data protrusion portion 511b.

Referring to FIG. 11C, a protective layer 130 is disposed on the gate insulating layer 120 on which the data pattern is formed. The protective layer 130 is patterned, so that at least a portion of the drain electrode DE, the data signal pads DSP and the first data dummy electrodes 515 of the first and second data dummy pads 510b and 520b may be exposed.

Referring to FIG. 10, a pixel electrode PE electrically connected to the drain electrode DE, and a transparent electrode TE electrically connected to the data signal pads DSP and the first data dummy electrodes 515 of the first and second data dummy pads 510b and 520b are disposed on the base substrate, on which the protective layer 130 is disposed, and an array substrate 100b of the display panel DP is formed.

In the example embodiment shown in FIG. 10, FIG. 11A, FIG. 11B and FIG. 11C, each of the data dummy pads and the first driving signal output line 701b are shown having a dual layer structure, however, the data signal pads DSP disposed adjacent to the data dummy pads may also have a dual-layer structure. The data signal pads DSP may have the dual-layer structure so that a voltage drop of the data signal pads DSP may be prevented.

According to the example embodiments of the display apparatus and the method of manufacturing the array substrate of the display apparatus shown in FIG. 10, FIG. 11A, FIG. 11B and FIG. 11C, the first and second data dummy electrodes 515 and 516 of the first data dummy pad 510b disposed adjacent to the first driving signal output line 701b have the first and second data protrusion portions 511b and 511c protruding toward the first driving signal output line 701b, respectively. Accordingly, static electricity provided through the first driving signal output line 701b is induced to flow into the first data dummy pad 510b, so that static electricity may be prevented from flowing into the data signal pads DSP. Thus, damage of the switching element SW electrically connected to the data signal pads DSP in the display area DA may be prevented.

In addition, the first driving signal output line 701b has the third and fourth data protrusion portions 711b and 721b spaced apart from and facing the first and second data protrusion portions 511b and 511c, respectively, so that the static electricity may be easily flowed into the first data dummy pad 510b having the first and second data protrusion portions 511b and 511c.

According to the present example embodiment, only the data dummy pads are described, however, gate dummy pads, as well as the data dummy pads, may be formed in the same method.

Figure 12:
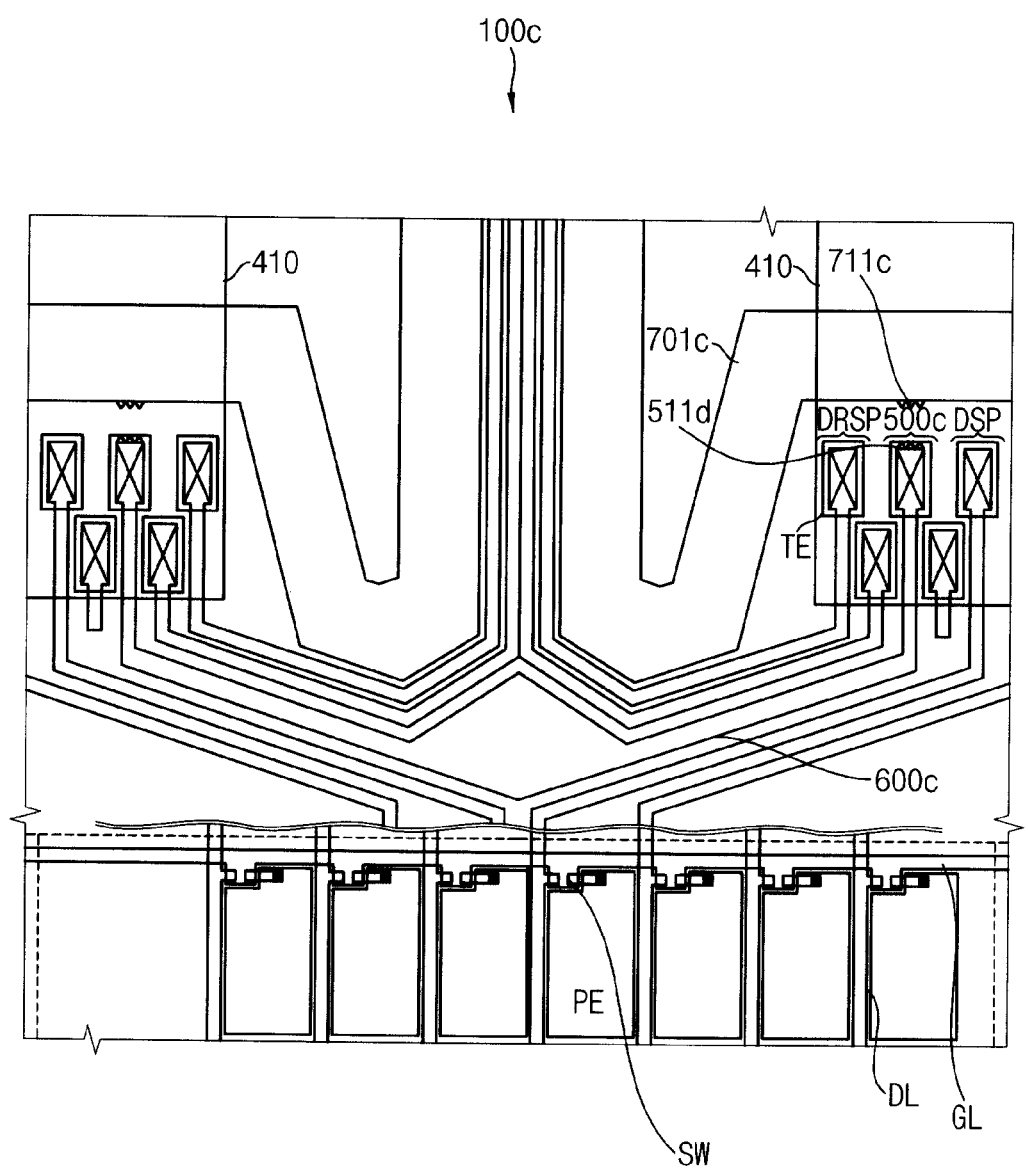
FIG. 12 is a plan view illustrating a display apparatus according to still another example embodiment.

FIG. 12 is a plan view illustrating a display apparatus according to still another example embodiment.

The display apparatus and a method of manufacturing the array substrate of the display apparatus according to the example embodiment shown in FIG. 12 are substantially the same as the display apparatus and the method of manufacturing the array substrate of the display apparatus according to the example embodiment shown in FIG. 1 FIG. 2A, FIG. 2B, FIG. 3A, FIG. 3B, FIG. 3C, FIG. 3D, FIG. 3E, FIG. 3F, FIG. 3G, FIG. 3H, FIG. 3I, FIG. 4A, FIG. 4B, FIG. 5A, FIG. 5B, FIG. 6A, FIG. 6B, FIG. 7A and FIG. 7B, except for positions of a dummy pad portion and an electrostatic capacitor. Accordingly, the same reference numerals will be used to refer to the same or like parts as those described in FIGS. 1 to 7B and any further repetitive explanation concerning the above elements will be omitted.

Referring to FIG. 12, the array substrate 100c of the display apparatus includes a base substrate 110. In addition, the array substrate 100c includes gate and data lines GL and DL, a switching element SW and a pixel electrode PE which are formed in the display area DA. Furthermore, the array substrate 100a includes a fan-out portion FO, an electrostatic prevention unit 300, driving drivers 400, a signal pad portion SP, a data dummy pad portion, a first static electricity capacitor 600*c* and a first driving signal output line 701*c*. The array substrate 100*c* may further include a transparent electrode TE.

The data dummy pad portion 500*c* is disposed parallel with data signal pads DSP and adjacent to the data signal pads DSP electrically connected to the same data driver 410. Particularly, the data dummy pad portion 500*c* is disposed between the data signal pads DSP electrically connected to the adjacent data driver 410. Alternatively, the data dummy pad portion 500*c* is disposed between the data signal pads DSP and driving signal pads DRSP providing a driving signal.

According to the example embodiment shown in FIG. 12, when the data signal pads are formed in two columns, the data dummy pad portion 500*c* may be formed in two columns to enhance a reliability of a display panel. Alternatively, the number of columns of the data dummy pad portion 500*c* may be changed according to the number of columns of the data signal pads DSP. Accordingly, the data dummy pad portion 500*c* includes first data dummy pads 510*c* of a first column, and second data dummy pads 520*c* of a second column. The first data dummy pads 510*c* are disposed closer to the first driving signal output line 701*c* than the second data dummy pads 520*c*.

At least one of the first data dummy pads 510*c* has a first end portion having a first data protrusion portion 511*d* facing and spaced apart from the first driving signal output line 701*c* and protruding toward the first driving signal output line 701*c*. The first data protrusion portion 511 includes at least one of first data protrusions. The first protrusion may have various shapes such as shown in FIGS. 3A to 3I. Accordingly, the first data protrusion portion 511*d* is disposed closer to the first driving signal output line 701*c* than the data signal pad DSP is, and static electricity generated from the first driving signal output line 701*c* is induced to flow into the first data dummy pads 510*c*. A second end portion opposite to the first end portion of the first data dummy pad 510*c* having the first data protrusion portion 511*d* is electrically connected to a first electrode 610*c* of the first static electricity capacitor 600*c*.

The first static electricity capacitor 600*c* is disposed on an area surrounded by data fan-out lines DFOL electrically connected to the data signal pads DSP, and by an external signal output line OSOL electrically connected to the dummy pads and the driving signal pad DRSP. Thus, the first static electricity capacitor 600*c* is disposed in an outer space of the data fan-out lines DFOL electrically connected to the same data driver 410 as the data fan out lines DFOL. The first static electricity capacitor 600*c* includes a first electrode electrically connected to the second end portion of the first data dummy pads 510*c* having the first data protrusion portion 511*d*, and a second electrode disposed under the first electrode. The first static electricity capacitor 600*c* stores static electricity provided through the first data protrusion portion 511*d*.

The first driving signal output line 701*c* has a second data protrusion portion 711*c* protruding toward the first data protrusion portion 511*d*. Accordingly, by widely forming the width of the first driving signal output line 701*c*, static electricity provided through the first driving signal output lines 701*c* during a process of manufacturing the display panel DP is induced to flow not into the data signal pads DSP, but rather into the first data dummy pads 510*c* having the first data protrusion portion 511*d* by the second data protrusion portion 711*c*.

Alternatively, the second data protrusion portions 711*c* may be omitted. Even if the second data protrusion portion 711*c* is omitted, static electricity provided through the first driving signal output lines 701*c* may be induced to flow into the first data dummy pads 510*c* by the first data protrusion portions 511*d*.

As described above with reference to FIG. 4A, the data dummy pads 500*c* and the first driving signal output line 701*c* may include the same data metal material as the source and drain electrodes SE and DE of the switching element SW and the data line DL.

Alternatively, the data dummy pads 500*c* may have a dual-layer structure having a first data dummy electrode of a first layer, and a second data dummy electrode of a second layer as described above with reference to FIG. 8. Accordingly, the second data dummy electrode includes the same gate metal material as the gate electrode of the switching element SW and the gate line GL, and the first data dummy electrode may include the data metal material. It is desirable that the first driving signal output line 701*c* include the gate metal material.

Alternatively, each of the data dummy pads 500*c* and the first driving signal output line 701*c* may have a dual-layer structure as described with reference to FIG. 10. For example, the data dummy pad 500*c* includes a first data dummy electrode of a first layer, and a second data dummy electrode of a second layer. In addition, the first driving signal output line 701*c* may have a first data output line of a first layer, and a second data output line of a second layer. It is a desirable that the first data dummy electrode and the first data output line include the gate metal material, and the second data dummy electrode and second data output line include the data metal material.

According to the present example embodiment, only the data dummy pads are described, however, gate dummy pads, as well as the data dummy pads, may be formed in the same method.

Figure 13:
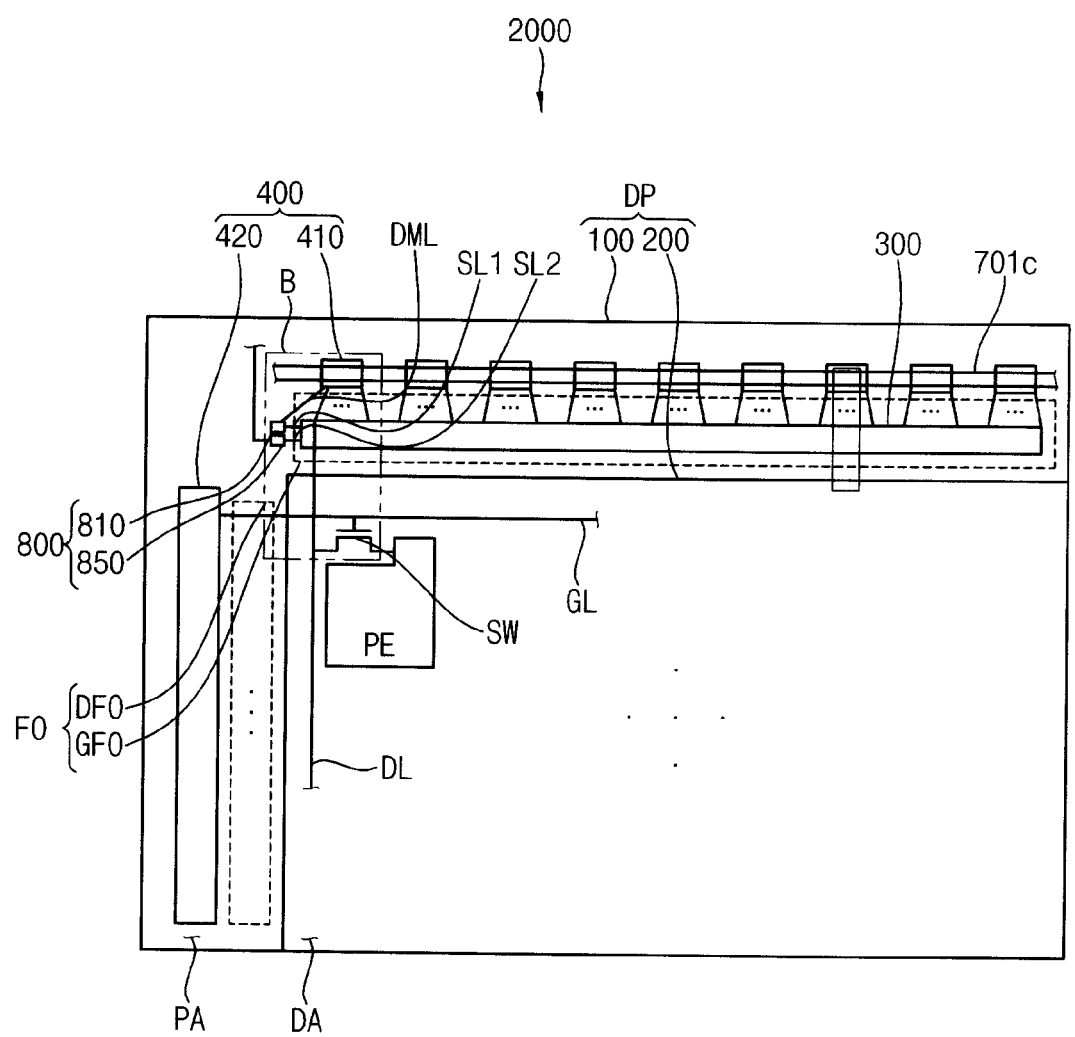
FIG. 13 is a plan view illustrating a display apparatus according to still another example embodiment.
Figure 14:
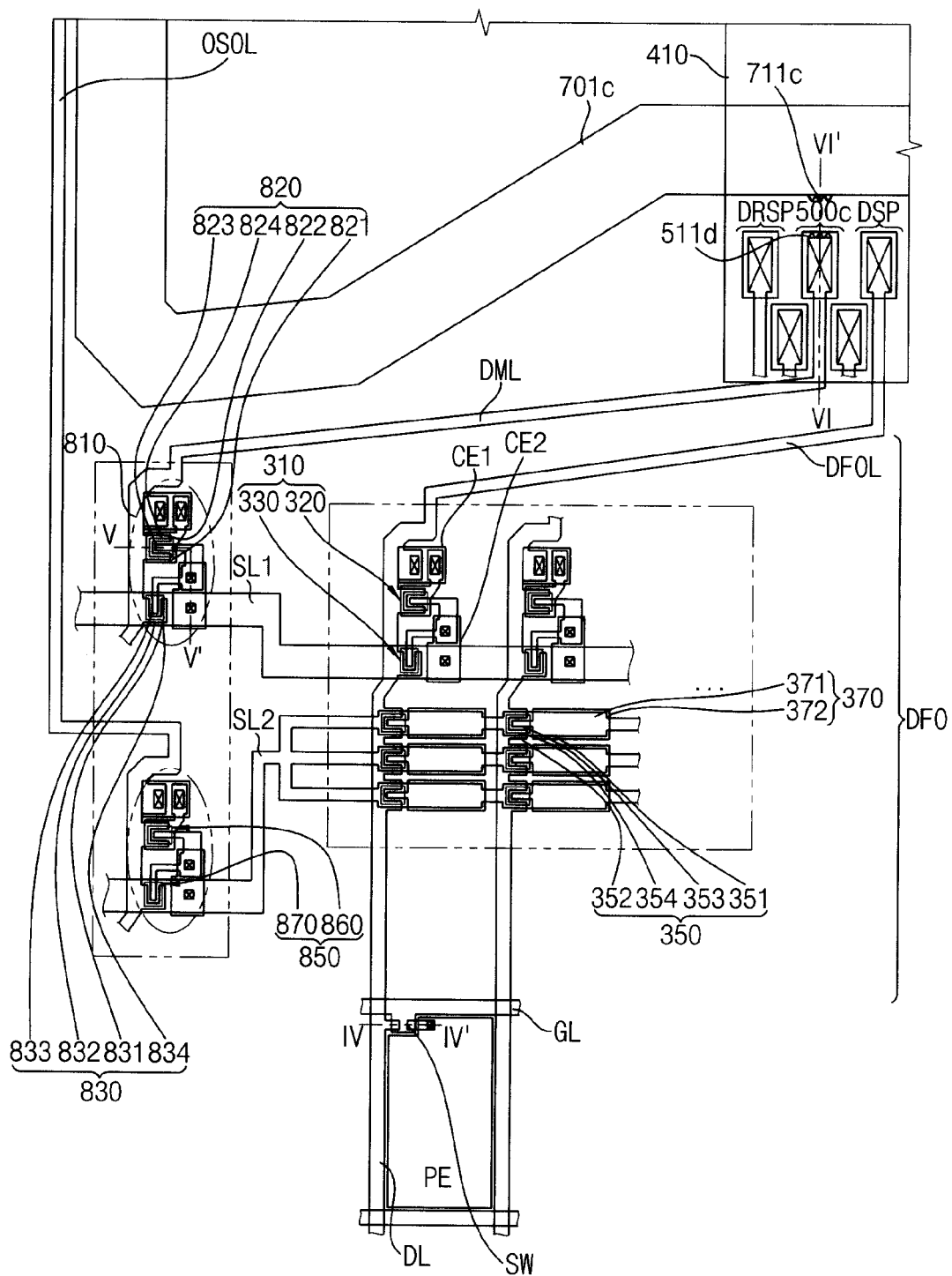
FIG. 14 is an enlarged plan view of portion 'B' in FIG. 13.
Figure 15:
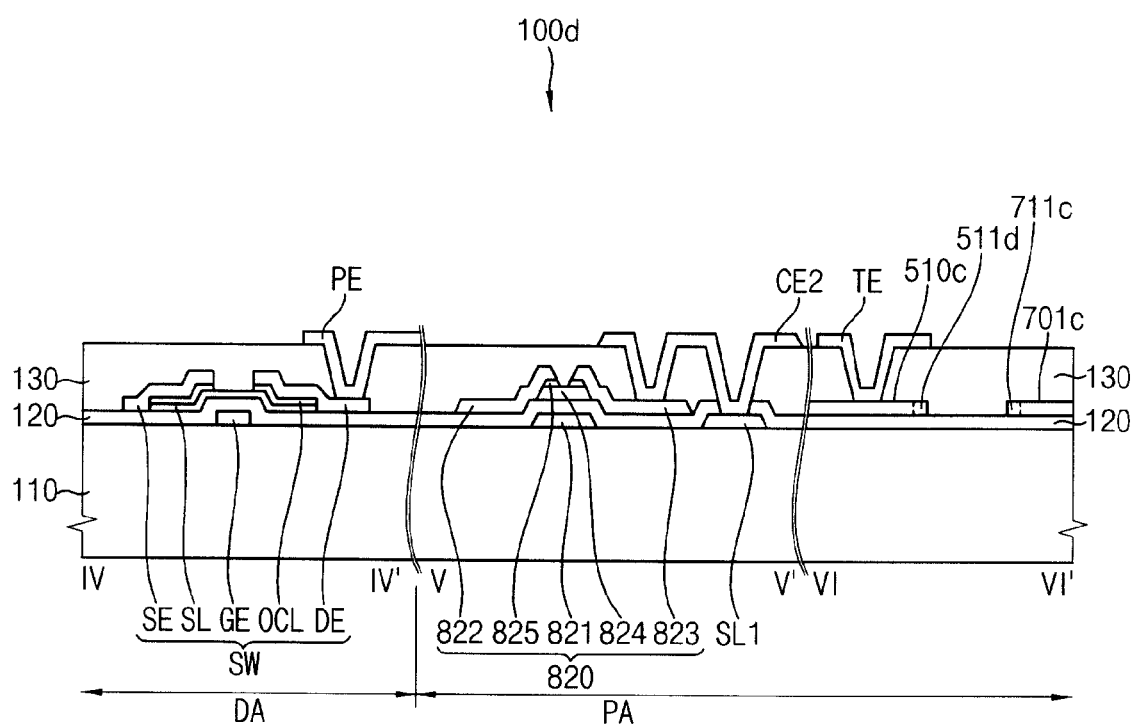
FIG. 15 is a cross-sectional view taken along lines IV-IV', V-V' and VI-VI' of FIG. 14.

FIG. 13 is a plan view illustrating a display apparatus according to still another example embodiment. FIG. 14 is an enlarged plan view of portion 'B' in FIG. 13. FIG. 15 is a cross-sectional view taken along lines IV-IV', V-V' and VI-VI' of FIG. 14.

The display apparatus according to the example embodiment shown in FIG. 13, FIG. 14 and FIG. 15 is substantially the same as the display apparatus according to the example embodiment described above with reference to FIG. 12, except for an electrostatic induction unit. Accordingly, the same reference numerals will be used to refer to the same or like parts as those described in FIG. 12 and any further repetitive explanation concerning the above elements will be omitted.

Referring to FIGS. 13 to 15, an array substrate 100*d* of the display apparatus 2000 includes a base substrate 110. In addition, the array substrate 100*d* includes gate and data lines GL and DL, a switching element SW and a pixel electrode PE, which are formed in the display area DA. Furthermore, the array substrate 100*d* includes a fan-out portion FO, a first electrostatic induction line SL1, a second electrostatic induction line SL2, an electrostatic induction unit 800, an electrostatic prevention unit 300, driving drivers 400, a signal pad portion SP, a data dummy pad portion 500*c* and a first driving signal output line 701*c*. The array substrate 100*d* may further include a transparent electrode TE.

The first and second electrostatic induction lines SL1 and SL 2 are aligned parallel with the gate line GL on the same layer, on which the gate line is disposed, in the peripheral area PA. The second electrostatic induction lines SL2 are electrically connected to each other.

The electrostatic induction unit 800 is disposed between the first dummy pad 510*c* and the electrostatic prevention unit 300. The electrostatic induction unit 800 is electrically connected to the first dummy pad 510c through a dummy line DML, and is electrically connected to an electrostatic prevention diode 310 of the electrostatic prevention unit 300 through the first electrostatic induction line SL1. The electrostatic induction unit 800 includes first and second electrostatic induction diodes 810 and 850. The first electrostatic induction diode 810 provides the electrostatic prevention diodes 310 with static electricity provided to the first protrusion portion 511d of the first dummy pad 510c through the second protrusion portion 711c of the first driving signal output line 701c. Accordingly, the electrostatic prevention diodes may distribute the static electricity.

The first electrostatic induction diode 810 includes first and second transistors 820 and 830. The first transistor 820 includes a first gate electrode 821, a first source electrode 822, a first drain electrode 823, a first semiconductor layer 824 and a first ohmic contact layer 825.

The first gate electrode 821 includes the same material as the gate line GL, and is electrically connected to the dummy line DML through a first connection electrode CE1. The first source electrode 822 is branched from the dummy line DML. The first drain electrode 823 is disposed apart from the first source electrode 822, and is electrically connected to a second drain electrode 833. The first drain electrode 823 is electrically connected to the first electrostatic induction line SL1 through a second connection electrode CE2. The first source and drain electrodes 822 and 823 include the same material as the data line DL. The first semiconductor layer 824 and the first ohmic contact layer 825 are disposed between the first gate electrode 821, and each of the first source and drain electrodes 822 and 823.

The second transistor 830 includes a second gate electrode 831, a second source electrode 832, the second drain electrode 833, a second semiconductor layer 834 and a second ohmic contact layer. The second gate electrode 831 is a portion of the first electrostatic induction line SL1. The second source electrode 832 is branched from the dummy line DML. Since the second gate electrode 831 of the second transistor 830 is a portion of the first electrostatic induction line SL1, it is desirable that the second source electrode 832 is disposed closer to the first electrostatic induction line SL1 than the first source electrode 822 is. The second drain electrode 833 is disposed spaced apart from the second source electrode 832, and is electrically connected to the first drain electrode 823. In addition, the second drain electrode 833 is electrically connected to the first electrostatic induction line SL1 through the second connection electrode CE2. The second semiconductor layer 834 and the second ohmic contact layer are disposed between the second gate electrode 831, and each of the second source and drain electrodes 832 and 833.

Accordingly, the first and second transistors 820 and 830 are electrically connected to each other, and an electrostatic prevention diode is formed. The first and second connection electrodes CE1 and CE2 may include the same material as the pixel electrode PE and the transparent electrode TE.

The second electrostatic induction diode 850 is disposed between external signal output lines OSOL providing a different external signal except for the driving signal output line 701c, and the electrostatic prevention transistor 350 of the electrostatic prevention unit 300. The second electrostatic induction diode 850 is electrically connected to the electrostatic prevention transistor 350 through the second electrostatic induction line SL2. The second electrostatic induction diode 850 may provide the electrostatic prevention transistor 350 with a static electricity provided through the external signal output lines OSOL. Accordingly, the static electricity provided to the electrostatic prevention transistor 350 through the external signal output lines OSOL may be stored in an electrostatic prevention capacitor 370 of the electrostatic prevention unit 300.

The second electrostatic induction diode 850 includes third and fourth transistors 860 and 870. The third transistor 860 includes a third gate electrode, a third source electrode, a third drain electrode, a third semiconductor layer and a third ohmic contact layer. The fourth transistor 870 includes a fourth gate electrode, a fourth source electrode, a fourth drain electrode, a fourth semiconductor layer and a fourth ohmic contact layer. The third and fourth source electrodes are branched from the external signal output line OSOL, and the second electrostatic induction diode 850 is substantially the same as the first electrostatic induction diode 810, except that the fourth gate electrode is a portion of the second electrostatic induction line SL2, so that any further repetitive explanation will be omitted.

The electrostatic prevention unit 300 is disposed between the signal pad portion SP and the gate line GL in the peripheral area PA. The electrostatic prevention unit 300 is electrically connected to data and gate fan-out lines of the fan-out portion FO. According to the example embodiment shown in FIG. 13, FIG. 14 and FIG. 15, the electrostatic prevention unit 300 is electrically connected to a data fan-out line DFOL. The electrostatic prevention unit 300 may include electrostatic prevention diodes 310, electrostatic prevention transistors 350 and electrostatic prevention capacitors 370.

Each of the electrostatic prevention diodes 310 includes fifth and sixth transistors 320 and 330. The fifth transistor 330 includes a fifth gate electrode, a fifth source electrode, a fifth drain electrode, a fifth semiconductor layer and a fifth ohmic contact layer. The sixth transistor 320 includes a sixth gate electrode, a sixth source electrode, a sixth drain electrode, a sixth semiconductor layer and a sixth ohmic contact layer. The electrostatic prevention diode 310 is substantially the same as the first electrostatic induction diode 810, except that the fifth and sixth source electrodes are branched from the data fan-out line DFOL, so that any further repetitive explanation will be omitted.

Each of the electrostatic prevention transistors 350 includes a seventh gate electrode 351, a seventh source electrode 352, a seventh drain electrode 353, a seventh semiconductor layer 354 and a seventh ohmic contact layer. The seventh gate electrode 351 is a portion of the second electrostatic induction line SL2. The seventh source electrode 352 is branched from the data fan-out line DFOL. The seventh drain electrode 353 is disposed spaced apart from the seventh source electrode 352, and is electrically connected to a second electrode 372 of the electrostatic prevention capacitor 370. The seventh drain electrode 353 may be electrically connected to the adjacent seventh drain electrode 353 of the electrostatic prevention transistor 350 along the data fan-out line DFOL through the transparent electrode (not shown). The seventh semiconductor layer 354 and the seventh ohmic contact layer are disposed between the seventh gate electrode 351, and each of the seventh source and drain electrodes 352 and 353.

The electrostatic prevention capacitor 370 includes a first electrode 371 and the second electrode 372. The first electrode 371 is a portion of the second electrostatic induction line SL2. The second electrode 372 is disposed over the first electrode 371, and is electrically connected to the seventh drain electrode 353.

The data dummy pad portion 500c and the first driving signal output line 701c are substantially the same as the data dummy pad portion and the first driving signal output line described with reference to FIG. 12, so that the same reference numerals will be used to refer to the same or like parts as those described in FIG. 12 and any further repetitive explanation concerning the above elements will be omitted.

As shown in FIG. 4A, the data dummy pads 500c and the first driving signal output line 701c may include the same material as the data line DL.

Alternatively, the data dummy pads 500c may have a dual-layer structure having a first data dummy electrode of a first layer, and a second data dummy electrode having a first data protrusion portion of a second layer. Accordingly, the second data dummy electrode may include the same material as the gate line GL, and the first data dummy electrode may include the same material as the data line DL. It is desirable that the first driving signal output line 701c includes the same material as the gate line GL as described with reference to FIG. 8.

Alternatively, each of the data dummy pads 500c and the first driving signal output line 701c may have a dual-layer structure as shown in FIG. 10. For example, the data dummy pad 500c includes a first data dummy electrode having a first data protrusion portion of a first layer, and a second data dummy electrode having a second data protrusion portion of a second layer, and the first driving signal output line 701c may have a first output line of a first layer, and a second output line of a second layer. The first data dummy electrode and the first output line may include the same material as the data line DL, and the second data dummy electrode and the second output line may include the same material as the gate line GL.

According to the example embodiment shown in FIG. 13, FIG. 14 and FIG. 15, the first data dummy pad 510c and the first driving signal output line 701c, respectively have the first and second data protrusion portions 511d and 711c spaced apart from and facing each other. Accordingly, static electricity provided through the first driving signal output line 701c is induced to flow into the first electrostatic induction diode 810 electrically connected to the first data dummy pad 510c, and the electrostatic prevention diode 310, so that static electricity may be prevented from flowing into the data signal pads DSP. Thus, damage of the switching element SW electrically connected to the data signal pads DSP in the display area DA may be prevented.

According to the present example embodiment, only the data dummy pads have been described, however, gate dummy pads as well as the data dummy pads may be formed by the same method.

According to example embodiments, at least one of dummy pads 500c disposed adjacent to signal pads SP have a first protrusion portion 511d protruding toward a driving signal output line 701c disposed adjacent to the signal pad SP and the dummy pad 500c, and static electricity provided to the driving signal output line 701c is induced to flow into an electrostatic capacitor 600c electrically connected to the dummy pad, so that a damage of the switching element SW in the display area DA may be prevented.

In addition, the driving signal output line 701c has a second protrusion portion 711c facing and spaced apart from a first protrusion portion 511d of the dummy pad 500c, and static electricity provided to the driving signal output line is induced to flow into the electrostatic capacitor electrically connected to the dummy pad, so that damage of the switching element SW in the display area DA may be prevented.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. An array substrate, comprising:
   a substrate comprising a display area and a peripheral area, the display area displaying an image, the peripheral area surrounding the display area;
   a dummy pad extending along a first direction in the peripheral area, and comprising a first protrusion portion protruding from an end portion of the dummy pad along the first direction;
   a driving signal output line to provide a driving signal, the driving signal output line extending along a second direction crossing with the first direction, and being disposed adjacent to the dummy pad;
   a signal pad disposed substantially parallel with the dummy pad; and
   an electrostatic capacitor disposed in the peripheral area between the signal pad and the display area and between the dummy pad and the display area, the electrostatic capacitor being electrically connected to the dummy pad,
   wherein the first protrusion portion comprises a plurality of protrusions disposed adjacent to each other with no other components disposed therebetween.

2. The array substrate of claim 1, further comprising:
   a signal pad disposed substantially parallel with the dummy pad;
   an electrostatic prevention unit disposed in the peripheral area between the signal pad and the display area and between the dummy pad and the display area, and electrically connected to the signal pad; and
   an electrostatic induction diode disposed between the driving signal output line and the display area, and electrically connected to the dummy pad and the electrostatic prevention unit.

3. The array substrate of claim 1, wherein the first protrusion portion comprises a wedge shape.

4. The array substrate of claim 1, further comprising:
   a data line extending along the first direction, and a gate line extending along the second direction in the display area,
   wherein the dummy pad comprises the same material as the data line.

5. The array substrate of claim 4, wherein the electrostatic capacitor comprises a first electrode and a second electrode, the first electrode being electrically connected to the dummy pad, and the second electrode being disposed under the first electrode.

6. The array substrate of claim 4, wherein
   the driving signal output line comprises the same material as the data line, and comprises a second protrusion portion facing the first protrusion portion, and
   the first protrusion portion has a wedge shape and the second protrusion portion has a wedge shape.

7. A display apparatus, comprising:
   an array substrate comprising a substrate, a dummy pad, a driving signal output line, the substrate comprising a display area displaying an image and a peripheral area surrounding the display area, the dummy pad extending along a first direction in the peripheral area and comprising a first protrusion portion protruding from an end portion of the dummy pad along the first direction, and the driving signal output line disposed adjacent to the dummy pad, extending along a second direction crossing with the first direction, and providing a driving signal; and a driving driver disposed over the dummy pad, and electrically connected to the dummy pad;

a signal pad electrically connected to the driving driver, the signal pad being disposed substantially parallel with the dummy pad; and an electrostatic capacitor disposed in the peripheral area between the driving driver and the display area, the electrostatic capacitor being electrically connected to the dummy pad, wherein:

the first protrusion portion comprises a plurality of protrusions disposed adjacent to each other with no other components disposed therebetween; and the dummy pad is disposed between adjacent signal pads.

8. The display apparatus of claim 7, wherein the first protrusion portion comprises a wedge shape.

\* \* \* \* \*